(12) United States Patent
Murakami et al.

(10) Patent No.: US 7,759,418 B2
(45) Date of Patent: Jul. 20, 2010

(54) FLAME RETARDANT RESIN COMPOSITION

(75) Inventors: Fumiki Murakami, Tokyo (JP); Jun-ichi Nakahashi, Tokyo (JP)

(73) Assignee: Asahi Kasei Chemicals Corporation, Tokyo (JP)

(*) Notice: Subject to any disclaimer, the term of this patent is extended or adjusted under 35 U.S.C. 154(b) by 104 days.

(21) Appl. No.: 11/665,668

(22) PCT Filed: Oct. 13, 2005

(86) PCT No.: PCT/JP2005/018838
§ 371 (c)(1),
(2), (4) Date: Apr. 18, 2007

(87) PCT Pub. No.: WO2006/043460
PCT Pub. Date: Apr. 27, 2006

(65) Prior Publication Data
US 2008/0051495 A1  Feb. 28, 2008

(30) Foreign Application Priority Data
Oct. 18, 2004 (JP) ............................. 2004-303317
May 18, 2005 (JP) ............................. 2005-145443

(51) Int. Cl.
B32B 7/12 (2006.01)
C08K 5/34 (2006.01)

(52) U.S. Cl. .................. 524/186; 524/100; 524/115
(58) Field of Classification Search .................. 524/186
See application file for complete search history.

(56) References Cited

U.S. PATENT DOCUMENTS

| | | | |
|---|---|---|---|
| 5,216,089 A | 6/1993 | Gallucci et al. | |
| 2002/0004545 A1* | 1/2002 | Tanigawa et al. | 524/414 |
| 2002/0198295 A1* | 12/2002 | Urabe et al. | 524/116 |
| 2003/0004240 A1* | 1/2003 | Harashina et al. | 524/138 |
| 2003/0018107 A1 | 1/2003 | Heinen et al. | |
| 2003/0083442 A1 | 5/2003 | Nishihara et al. | |
| 2004/0039134 A1* | 2/2004 | Murakami et al. | 525/410 |

FOREIGN PATENT DOCUMENTS

| | | |
|---|---|---|
| JP | 59-59724 | 4/1984 |
| JP | 60-58461 | 4/1985 |
| JP | 63-108059 | 5/1988 |
| JP | 63-301222 | 12/1988 |
| JP | 2-276823 | 11/1990 |
| JP | 3-73590 | 11/1991 |
| JP | 6-100684 | 4/1994 |
| JP | 8-225714 | 9/1996 |
| JP | 9-13038 | 1/1997 |
| JP | 10-182832 | 7/1998 |
| JP | 11-246643 | 9/1999 |
| JP | 2000-212404 | 8/2000 |
| JP | 2000-234091 | 8/2000 |
| JP | 2000-273113 | 10/2000 |
| JP | 2000-273132 | 10/2000 |
| JP | 2001-164256 | 6/2001 |
| JP | 2003-82210 | 3/2003 |
| JP | 2003-510392 | 3/2003 |
| JP | 2004-107374 | 4/2004 |
| JP | 2004-149448 | 5/2004 |
| JP | 2004-155802 | 6/2004 |
| JP | 2004-277676 | 10/2004 |
| JP | 2004-323822 | 11/2004 |
| WO | 00/09518 | 2/2000 |
| WO | WO 01/44351 | 6/2001 |
| WO | 03/002666 | 1/2003 |
| WO | WO 2004/024844 | 3/2004 |

OTHER PUBLICATIONS

"Kobunshi Kagaku" Shunsuke Murahashi et al. 4th Edition, Kyoritsu Shuppan Co., Ltd. 1993. pp. 26-27.
International Search Report of the International Published Application No. PCT/JP2005/018838, mailed Nov. 15, 2005.
James E. Mark, Harry R. Allcock, Robert West, "Inorganic Polymers" Pretice-Hall International Inc. 1992 pp. 61-140.
"Kobunshi Kagaku" Shunsuke Murahashi et al. 4th Edition, Kyoritsu Shuppan Co., Ltd. 1993. pp. 1-6.

* cited by examiner

Primary Examiner—Vasu Jagannathan
Assistant Examiner—Doris L Lee
(74) Attorney, Agent, or Firm—Staas & Halsey LLP

(57) ABSTRACT

A flame retardant composition comprising a specific phenolic-based resin (A) and a specific phosphor compound (B) can be suitably used for a resin and can provide a resin composition which is excellent in flame retardancy, thermal resistance, moisture resistance, extrusion workability, demolding availability, thermal stability, impact resistance, mechanical properties and the like.

26 Claims, 4 Drawing Sheets

GPC Chart of (A-1)

GPC Chart of (A-2)

GPC Chart of (A-4)

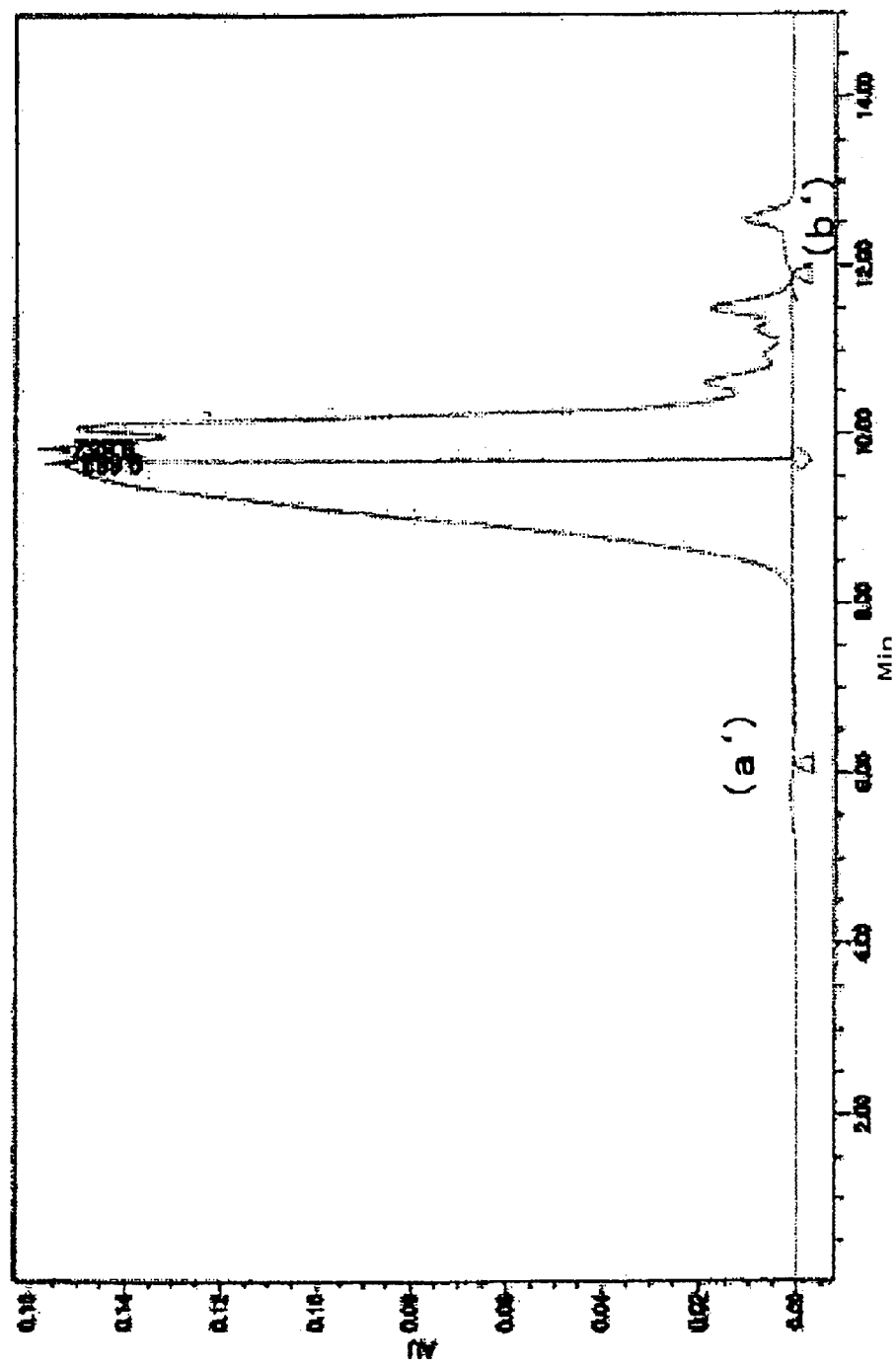

FLAME RETARDANT RESIN COMPOSITION

This application is based on PCT Application No. PCT/JP2005/018838 filed Oct. 13, 2005 and Japanese Application Nos. 2004-303317 and 2005-145443, filed Oct. 18, 2004 and May 18, 2005 respectively in Japan, the disclosures of which are hereby incorporated herein by reference.

TECHNICAL FIELD

The present invention relates to a flame retardant composition. More specifically, the invention relates to a flame retardant composition excellent in processability as well as flame retardancy, moisture resistance, thermal resistance, and extrusion workability when it is added to resins.

BACKGROUND ART

Conventional methods for flame retardation of flammable resins include those which comprise adding chloride-containing compound, bromide-containing compound or antimony trioxide to resins; and incorporating chloride-containing compound or bromide-containing compound into resins. However, it has been said that these methods are not preferred from the viewpoint of environmental protection and toxicity, and improvement of flame retarding methods has been required. As to the flame retarding methods devoid of chloride-containing compound or bromide-containing compound, the method using phosphorus-based flame retardants have been investigated.

It has been said that the mechanism of flame retardation for resins is to block heat and oxygen supply to a burning resin with a film of polyphosphate phase formed on the resin surface during burning and a char layer formed by dehydration of the resin. This mechanism is considered to be particularly effective against resins for which it is easy to form a char film, that is, easy to dehydrate. While, for the flame retardation of a resin for which it is hard to form a char film by dehydration with phosphorus or a phosphor compound, an amount of phosphorus or a phosphor compound to be incorporated into the resin needs to be increased since the flame retardation of the resin mainly depends on a film formed by polyphosphate phase.

For flame retardation of resins for which it is hard to form a char film without increasing the amount of phosphorus and phosphor compounds, it will be conceived to employ a flame retardant resin composition incorporating a component to be a raw material of a char film in advance.

Patent Document 3 proposes a method using a crosslinked phosphazene compound and a polyphenylene ether resin as a flame retardant for flame retardation of polyalkylene allylate-based resin. The crosslinked phosphazene compound and polyphenylene ether resin impart good flame retardancy to a polyalkylene allylate-based resin. However, the polyalkylene allylate-based resin containing the crosslinked phosphazene compound and polyphenylene ether resin as a flame retardant is not sufficient enough in processability, thermal resistance, mechanical property, dielectric characteristic, and appearance of the molded article thereof.

There has also been disclosed an art for flame retardation by adding a phenol resin (to the flammable resin) having a weight average molecular weight in polystyrene equivalent of 500,000 or more (Patent Document 4). However, the addition of such a high molecular weight phenol resin unfavorably causes considerable deterioration in processing flowability and effect of imparting flame retardancy.

Further, there has been disclosed an art achieving flame retardation without deteriorating of inherent mechanical properties of a resin by using a novolac-type phenolic resin having a weight average molecular weight in polystyrene equivalent of 5,000 or more and less than 50,000 and containing unreacted phenol in an amount of less than 0.5 wt % of (Patent Document 5). However, this art does not teach any technical thought that a ratio of high molecular weight component and low molecular weight component contained in the phenol resin in a specific range suppresses lowering of thermal resistance while maintaining excellent flame retardancy, mechanical properties and processability, that is, it does not suggest the present invention.

Patent Document 6 discloses a method for flame retardation of polyalkylene terephthalate resin by using a phenol-based resin and a phenoxyphosphazene in combination. According to this method, however, it is not possible to impart to a resin flame retardancy, thermal resistance, impact strength, moldability (appearance) and mechanical strength in good balance since a full investigation about phenol-based resins has not been made.

These references do not lead to the effects attained by the present inventors, namely, the effects that a flame retardant resin comprising specific phenol resins and phosphate compounds maintain or improve not only flame retardancy but also various properties such as thermal resistance, mechanical property, workability, and low smoke evolution in good balance. It was the present invention to achieve the excellent effects as described hereinafter.

Patent Document 1: Japanese Patent Publication No. 3-73590
Patent Document 2: Japanese Patent Application Laid-Open No. 8-225714
Patent Document 3: International Publication No. WO 03/002666
Patent Document 4: Japanese Patent Application Laid-Open No. 2000-273132
Patent Document 5: Japanese Patent Application Laid-Open No. 2001-164256
Patent Document 6: International Publication No. WO 01/048086

DISCLOSURE OF THE INVENTION

Problems to be Solved by the Invention

An embodiment of the present invention provides a flame retardant resin composition free from chlorine compound or bromine compound and exhibits excellent flame retardancy, moisture resistance, thermal resistance, dielectric property, low smoke evolution and extruding activity when added to a flammable resin.

Means for Solving the Problems

The present inventors made intensive studies to solve the above-described problems. As a result, they have found that a flame retardant resin composition can be obtained by adding a flame retardant composition comprising (A) a specific phenol resin and (B) a specific phosphor compound to a resin. Incorporation of the flame retardant composition into a resin promotes formation of a char film on the surface of the resin and imparts constant flame retardancy to a resin for which it is otherwise hard to form a char film on the surface, and further provides a flame retardant resin composition which is excellent in thermal resistance, moisture resistance, thermal stability, impact resistance, mechanical property and extrusion workability and produces a molded article with good appearance. The present invention has been achieved on the basis of these findings.

That is, the present invention relates to:

1. A flame retardant composition comprising:

(A) a phenol-based resin which has an area fraction (a) with a weight average molecular weight in polystyrene equivalent of 870 or more and an area fraction (b) with a weight average molecular weight in polystyrene equivalent of less than 870, the area fraction (a) being 74% or more and 98% or less based on the total 100% of the area fractions (a) and (b), and has a weight average molecular weight in polystyrene equivalent of 2,000 to 80,000, the weight average molecular weight in polystyrene equivalent being measured with a gel permeation chromatography using a tetrahydrofuran as a solvent at a column temperature of 35° C. at a flow rate of 1 mL/min; and (B) a phosphor compound (excluding non-condensed phosphoric ester).

2. The flame retardant composition according to the above 1, characterized in that the component (A) is a novolac-type phenol resin.

3. The flame retardant composition according to the above 1 or 2, characterized in that the component (A) contains a tri-nuclear complex component in an amount of 7% or less.

4. The flame retardant composition according to any one of the above 1 to 3, characterized in that the component (A) contains a bi-nuclear complex component in an amount of 10% or less.

5. The flame retardant composition according to any one of the above 1 to 4, characterized in that the component (B) comprises at least one selected from the group consisting of condensed phosphoric ester, phosphinate and phosphazene compound.

6. The flame retardant composition according to any one of the above 1 to 4, characterized in that the component (B) comprises at least one member selected from the group consisting of condensed phosphoric ester and phosphazene compound.

7. The flame retardant composition according to any one of the above 1 to 4, characterized in that the component (B) contains at least phosphazene compound.

8. The flame retardant composition according to any one of the above 1 to 4, characterized in that the component (B) comprises a phosphazene compound and a content of a cyclic trimer and/or a cyclic tetramer is in 80 wt % or more.

9. The flame retardant composition according to any one of the above 1 to 4, characterized in that the component (B) comprises a phosphazene compound and a content of a cyclic trimer is 76 wt % or more.

10. A flame retardant composition comprising:

(A) a novolac-type phenol-based resin having a content of a tri-nuclear complex composition of 7% or less and a weight average molecular weight in polystyrene equivalent of 2,000 to 80,000; and (B) at least one phosphor compound selected form the group consisting of a condensed phosphoric ester and a phosphazene compound.

11. The flame retardant composition according to any one of the above 1 to 10, characterized in that the composition further incorporates a nitrogen-containing compound.

12. The flame retardant composition according to the above 11, characterized in that the nitrogen-containing compound is a triazine-based compound.

13. The flame retardant composition according to the above 1 to 12, characterized in that the contents of the components (A) and (B) are 1 to 90 parts by weight and 10 to 99 parts by weight, respectively, relative to the total of 100 parts by weight of the components (A) and (B).

14. The resin composition comprising a resin (C) and the flame retardant composition according to any one of the above 1 to 13.

15. The resin composition according to the above 14, characterized in that the content of the flame retardant composition (the total of the components (A) and (B)) is 0.1 to 200 parts by weight relative to 100 parts by weight of the resin (C).

16. The resin composition according to the above 14 or 15, characterized in that the resin (C) comprises at least one selected from the group consisting of polyphenylene ether-based resin, polystyrene-based resin, polyalkylene allylate-based resin, polyamide-based resin, polycarbonate-based resin, polyphenylene sulfide-based resin, polypropylene, polyethylene, ABS (acrylonitrile butadiene styrene) resin, thermotropic liquid crystal and polystyrene-containing elastomer.

17. The resin composition according to the above 14 or 15, characterized in that the resin (C) comprises at least one selected from the group consisting of polyalkylene allylate-based resin and polyamide-based resin.

18. A resin composition comprising polyamide resin having 5 to 75 wt % of aromatic ring component in a main chain and the flame retardant composition according to any one of the above 1 to 13.

19. The resin composition according to any one of the above 14 to 18, characterized in further comprising a filler.

20. The resin composition according to the above 19, characterized in that the content of the filler is 1 to 200 parts by weight relative to the total of 100 parts by weight of the components other than the filler.

21. A molded article formed with the resin composition according to any one of the above 14 to 20.

Advantages of the Invention

A flame retardant composition comprising a specific phenol-based resin (A) and a specific phosphor compound (B) provides a resin composition which exhibits excellent flame retardancy, thermal resistance, moisture resistance, extrusion workability, mold releasability, thermal stability, impact resistance, mechanical properties and the like especially when added to a resin.

Best Mode for Carrying Out the Invention

The present invention will be explained in detail below.

In an embodiment of the present invention, (A) a specific phenol-based resin and (B) a specific phosphor compound are essential components. A flame retardant composition prepared by appropriately combining these components the flame retardant resin composition facilitates development of a char layer upon heating at a high temperature and imparts excellent flame retardancy and mechanical properties to a resin composition together with good appearance to a molded article formed with the resin composition even when it is added to a resin in a small amount.

(A) Phenol-Based Resin

In an embodiment of the present invention, the combination of a phenol-based resin and component (B) of phosphor compound generates a synergetic effect and imparts excellent flame retardancy, thermal resistance, mechanical properties to the resin composition, and further imparts good appearance to a molded article formed therewith. The phenol-based resin used in the present invention has an area fraction (a) with a weight average molecular weight in polystyrene equivalent of 870 or more and an area fraction (b) with a weight average molecular weight in polystyrene equivalent of less than 870, which are measured with a gel permeation chromatography (GPC) by using a tetrahydrofuran as a solvent at a column temperature of 35° C. at a flow rate of 1 mL/min, and the proportion of the area fraction (a) is 74% to 98%, preferably 74% to 95%, more preferably 74% to 92% based on the total 100% of the area fractions (a) and (b).

In view of the balance of flame retardancy, thermal resistance, processability and the like, a phenol-based resin preferably used is such that contains a tri-nuclear complex exhibiting peak top around a retention time of 10.0 to 10.1 minutes, which is measured by GPC using a tetrahydrofuran as a solvent in proportion of 7% or less, preferably 5% or less, more preferably 4% or less, further preferably 3% or less.

In an embodiment of the present invention, a phenol-based resin satisfying the above mentioned conditions, namely, a phenol-based resin having an area fraction (a) in proportion of 74% or more and 98% or less based on the total 100% of the area fraction (a) at a retention time of 6.1 to 9.7 minutes and the area fraction (b) at a retention time of 9.7 to 11.9 minutes, which are measured with a GPC using a tetrahydrofuran as a solvent at a column temperature of 35° C. at a flow rate of 1 mL/min, imparts excellent flame retardancy, thermal resistance, mechanical properties, processability and the like to the resin composition and good appearance to a molded article formed with the resin composition thereof, and especially enhances flame retardancy synergically. The proportion of the area fraction (a) is preferably 74% or more and 95% or less, more preferably 74% or more and 92% or less, most preferably 74% or more and 90% or less.

The measurement of the area fraction of a phenol-based resin with a GPC is conducted using Waters Alliance (manufactured by Nihon Waters K.K.) under the conditions of a tetrahydrofuran solvent, a column temperature of 35° C. and a flow rate of 1 mL/min. For the column, Waters Styragel HR1, HR3 and HR4 (manufactured by Nihon Waters K.K.) are connected in series. As a detector, UV (Waters 2487; wavelength: 254 nm) and/or RI (Waters 2414) are used. The area fraction at a retention time of 6.1 to 9.7 minutes and 9.7 to 11.9 minutes is calculated by the following process. When area enclosed by the GPC chart baseline, the GPC curve at 6.1 to 9.7 minutes and a vertical line drawn from the GPC curve to the GPC chart baseline at a retention time of 9.7 minutes is regarded as area (a'), and the area enclosed by the GPC chart baseline, the GPC curve at 9.7 to 11.9 minutes and a vertical line drawn from the GPC curve to the GPC chart baseline at a retention time of 11.9 minutes is regarded as area (b'), the percentage of (a') relative to the total of (a') and (b') is regarded as an area fraction (a) and that of (b') is as an area fraction (b). A calibration curve is prepared using standard polystyrene. A molecular weight at a retention time of 9.7 minutes calculated on the basis of the calibration curve was about 870.

Further, the content of the tri-nuclear complex is measured as follows. A peak exhibiting its peak top at around a retention time of 10.0 to 10.1 minutes is regarded as a peak of the tri-nuclear complex with a GPC under the above mentioned condition. The area (S1), which is encompassed with a straight line vertically drawn down from a point showing the lowest absorbance value (Bottom 1) between the peak of the tri-nuclear complex and a peak exhibiting its top peak at around a retention time of 9.8 minutes, a straight line vertically drawn down from a point showing the lowest absorbance value (Bottom 2) between the peak of the tri-nuclear complex and a peak exhibiting its top peak around a retention time of 10.4 minutes, the base line and the GPC curve, is divided with the area (the whole area S2), which is encompassed with the GPC curve and the base line in a retention time of 6.1 to 11.9 minutes, and further is multiplied by 100 to obtain a peak area fraction (%) of the tri-nuclear complex. The thus-obtained value is regarded as a content of the tri-nuclear complex. Peaks exhibiting its peak top at around a retention time of 10.4 to 10.7 minutes are regarded as a peak of the bi-nuclear complex and at around a retention time of 11.1 to 11.3 minutes are regarded as a peak of a free monomer, respectively, and the each area fraction is calculated. The obtained area fraction of each component is regarded as its content.

As the phenol-based resin used in the present invention, any phenol resin can be used so long as it has conventionally known structures. The examples of the phenol resins include but are not limited to novolac-type phenol-based resin, resol-type phenol-based resin, phenol aralkyl-based resin, polyvinyl phenol-based resin, and the like. These resins can be modified with cashew, oil, rubber or the like. Of these, in view of a balance in flame retardancy imparting effects, production cost and the like, novolac-type phenol-based resin can be particularly preferably used.

A production method for a novolac-type phenol-based resin preferably used in accordance with an embodiment of the present invention is not particularly limited so long as it does not exceed the range of the present invention. In general, the resin can be obtained by addition condensation of phenols and aldehydes in the presence or absence of an acid catalyst.

A resol-type phenol-based resin can be obtained by addition condensation of phenols and aldehydes in the presence of a basic catalyst.

The phenols suitably used may include phenols with substituted with an alkyl groups of 0 to 12 carbon atoms such as phenol, cresol, xylenol, ethyl phenol, propyl phenol, bisphenol A, bisphenol F, butylphenol, pentyl phenol, alkylphenol, and resorcin. Moreover, the aldehydes suitably used may include formaldehyde, acetaldehyde, propyl aldehyde, and benzenes having formyl group.

An acid catalyst which can be used for condensation reaction of phenols and aldehydes is not particularly limited. For example, hydrochloric acid, sulfuric acid, phosphoric acid, oxalic acid, toluene sulfonic acid and the like are preferably used.

A phenol-based resin used in the present invention preferably has a weight average molecular weight in polystyrene equivalent of 2,000 to 80,000, more preferably 2,000 to 50,000, further preferably 3,000 to 50,000, especially preferably 3,000 to 30,000 from the viewpoint of a balance in flame retardancy imparting effects, mechanical properties, processability and workability.

From the viewpoint of molding flowability, mechanical properties, low smoke evolution and the like, it is preferable that the phenol-based resin used in an embodiment of the present invention preferably contains a bi-nuclear complex in a smaller amount. Specifically, the content of the bi-nuclear complex measured according to the GPC of the bi-nuclear complex and free monomer described in Examples of the present invention is preferably 10% or less in an area fraction. Considering the problem caused by the bleeding upon extrusion or molding, a phenol-based resin with a content of the free monomer is 5% or less, preferably 3% or less is suitably used. Further, if higher flame retardancy, molding flowability, mechanical properties, thermal stability, workability and the like are required, a phenol-based resin with the total content of a free monomer, bi-nuclear complex and tri-nuclear complex of 17.5% or less, more preferably 17.0% or less, further more preferably 16.5% or less is suitably used.

The production method of the above phenol-based resins are not limited. An example thereof includes the methods disclosed in Japanese Patent Application Laid-Open No. 2004-323822 and Japanese Patent Application Laid-Open No. 11-246643.

(B) Phosphor Compound

In an embodiment of the present invention, any known phosphor compound other than non-condensed phosphoric esters are preferably used. Examples of the phosphor compounds include condensed phosphate ester, phosphazene compound, phosphinate, phosphonate, phosphate ester amid, phosphorised polymer, phosphinic oxide, phosphinic sulfide, tertiary phosphinics such as triaryl phosphine, trialkyl phosphine, bis(diarylphosphino)benzene and tris(diarylphosphino)benzene, and the like. These compounds may be used singly or in combination. Non-condensed phosphate such as triphenylphosphate or tricresylphosphate is not preferable because it unfavorably exhibits poor workability and processability when combined with a specific phenol resin (A).

(B-1) Phosphazene Compound

As the phosphazene compound suitably used in an embodiment of the present invention, various known compounds can be used. A structure of the phosphazene compounds suitably used in an embodiment of the present invention is described, for example, in "Inorganic Polymers", 1992 p61-p140, James E. Mark, Harry R. Allcock, and Robert West, Pretice-Hall International, Inc. For instance, the compounds include cyclic phosphazene compounds represented by the following formula (1) and/or chain phosphazene compounds represented by the following formula (2).

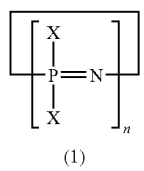

(1)

[Formula 1]

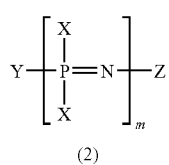

(2)

[Formula 2]

Among them, phosphazene compounds having the above structures in an amount of 95 wt % is preferred.

In the above formulas, n is an integer of 3-25, m is an integer of 3-10,000, and a substituent X is at least one substituent selected from the group consisting of an alkyl group of 1-6 carbon atoms, an aryl group of 6-11 carbon atoms, a fluorine atom, an aryloxy group having a substituent represented by the following formula (3), a naphthyloxy group, and an alkoxy group or alkoxy-substituted alkoxy group of 1-6 carbon atoms.

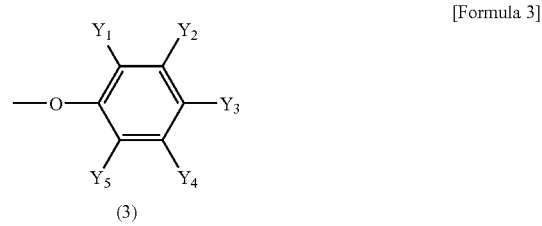

(3)

[Formula 3]

(wherein $Y_1$, $Y_2$, $Y_3$, $Y_4$ and $Y_5$ represent at least one substituent selected from the group consisting of a hydrogen atom, a fluorine atom, an alkyl group or alkoxy group of 1-5 carbon atoms, phenyl group and a group containing a hetero atom.) One or more or all of the hydrogen atoms on the substituent may be substituted with fluorine. Y in the above formula represents —N=P(O)(X) or —N=P(X)$_3$, and Z represents —P(X)$_4$ or —P(O)(X)$_2$.

These compounds may be used singly or in combination.

One of the factors used for determining flame retardancy is the concentration of phosphorus atoms contained in a molecule of the phosphazene compound. In the phosphazene compounds, chain phosphazene compounds with a chain structure have substituents at molecular ends such that phosphorus content thereof is lower than cyclic phosphazene compounds. In the case that the phosphazene compound and the cyclic phosphazene compound are added in the same amount, it is considered that the cyclic phosphazene compounds more effectively impart flame retardancy than the chain phosphazene compounds. Accordingly, in an embodiment of the present invention, the phosphazene compound with cyclic structure are preferably employed. In addition, the phosphor compound containing the cyclic phosphazene composition in an amount of 95 wt % or more is preferable.

The substituent X in the phosphazene compound is not particularly limited. The substituent X includes, for example, alkyl groups such as methyl group, ethyl group, n-propyl group, isopropyl group, n-butyl group, s-butyl group, tert-butyl group, n-amyl group, and isoamyl group;

aryl groups such as phenyl group, 2-methylphenyl group, 3-methylphenyl group, 4-methylphenyl group, 2,6-dimethylphenyl group, 3,5-dimethylphenyl group, 2,5-dimethylphenyl group, 2,4-dimethylphenyl group, 3,4-dimethylphenyl group, 4-tert-butylphenyl group, and 2-methyl-4-tert-butylphenyl group;

alkoxy groups such as methoxy group, ethoxy group, n-propyloxy group, isopropyloxy group, n-butyloxy group, tert-butyloxy group, s-butyloxy group, n-amyloxy group, isoamyloxy group, tert-amyloxy group, and n-hexyloxy group;

alkoxy substituted alkoxy group such as methoxy methoxy group, methoxy ethoxy group, methoxy ethoxy methoxy group, methoxy ethoxy ethoxy group, and methoxy propyloxy group;

alkyl substituted phenoxy group such as phenoxy group, 2-methylphenoxy group, 3-methylphenoxy group, 4-methylphenoxy group, 2,6-dimethylphenoxy group, 2,5-dimethylphenoxy group, 2,4-dimethylphenoxy group, 3,5-dimethylphenoxy group, 3,4-dimethylphenoxy group, 2,3,4-trimethylphenoxy group, 2,3,5-trimethylphenoxy group, 2,3,6-trimethylphenoxy group, 2,4,6-trimethylphenoxy group, 2,4,5-trimethylphenoxy group, 3,4,5-trimethylphenoxy group, 2-ethylphenoxy group, 3-ethylphenoxy group, 4-ethylphenoxy group, 2,6-diethylphenoxy group, 2,5-diethylphenoxy group, 2,4-diethylphenoxy group, 3,5-diethylphenoxy group, 3,4-diethylphenoxy group, 4-n-propylphenoxy group, 4-isopropyl phenoxy group, 4-tert-butylphenoxy group, 2-methyl-4-tert-butylphenoxy group, 2-phenylphenoxy group, 3-phenylphenoxy group, and 4-phenylphenoxy group;

aryl substituted phenoxy group; naphthyl group; naphthyloxy group; and the like. The hydrogen contained in a part or the whole of these groups may be substituted with groups containing fluorine and/or hetero atoms. The group containing hetero atoms herein indicates groups containing B, N, O, Si, P, S atoms. For example, there can be exemplified amino group, amide group, aldehyde group, glycidyl group, carboxyl group, hydroxide group, mercapto group, silyl group, and the like.

Further, these phosphazene compounds may be crosslinked with a crosslinking group selected from the group consisting of phenylene group, biphenylene group and groups represented by the formula (4) according to the technology disclosed in International Publication No. WO00/09518.

[Formula 4]

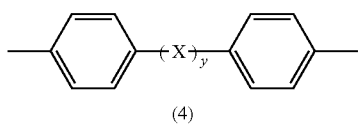

(4)

(wherein X represents —C(CH$_3$)$_2$—, —SO$_2$—, —S— or —O—, and y represents 0 or 1.) These phosphazene compounds with crosslinked structures may be specifically produced by reacting a dichlorophosphazene oligomer with an alkali metal salt of phenol and an alkali metal salt of an aromatic dihydroxy compound. These alkali metal salts are added to the dichlorophosphazene oligomer in an amount slightly exceeding a theoretical amount.

These phosphazene compounds may be used singly or in combination.

Furthermore, the phosphazene compound may be a mixture of phosphazene compounds having different structures, i.e., cyclic phosphazene compounds such as cyclic trimers and cyclic tetramers, and chain phosphazene compound. Processability of a resin composition incorporating the phosphazene compound tends to be more preferable as the contents of cyclic trimers and cyclic tetramers increase. Specifically, the preferred phosphazene compounds contain cyclic trimer and/or tetramer compounds in an amount of 80 wt % or more, preferably 85 wt % or more, more preferably 93 wt % or more. Further, when the phosphazene compound is used in combination with a phenol resin specified in an embodiment of the present invention, using the phosphazene compound with a trimer content of 70 wt % or more, preferably 76 wt % or more, more preferably 80 wt % or more, is effective to impart excellent flame retardancy and to improve mechanical properties.

Depending on a kind or structure of substituents, the phosphazene compound can take various forms such as liquid, wax and solid. It may be in any form so long as the effects of the present invention are not damaged. A phosphazene compound in a solid form may have a bulk density of not lower than 0.45 g/cm$^3$, preferably not lower than 0.45 g/cm$^3$ and not higher than 0.75 g/cm$^3$.

Each of the contents of alkali metal components such as sodium and potassium in the phosphazene compound is preferably 200 ppm or less, more preferably 50 ppm or less, and further more preferably the total content of alkali metal components is 50 ppm or less. In addition, it is desired that the content of the phosphazene compound in which at least one of the substituents X in the formula (1) is a hydroxyl group, namely, the phosphazene compound containing a P—OH bond, is less than 1 wt %, and that the content of chlorine is 1000 ppm or less, preferably 500 ppm or less, more preferably 300 ppm or less based on the total weight of the phosphazene compound.

The phosphazene compound in which at least one of the substituents X is a hydroxyl group can have an oxo structure represented by the following formula (5). It is desired that the content of the oxo compound is less than 1 wt % in the phosphazene compound as well as the content of the phosphazene compound containing a hydroxyl group. The same can be applied to the phosphazene compound having a chain structure represented by the above formula (2).

[Formula 5]

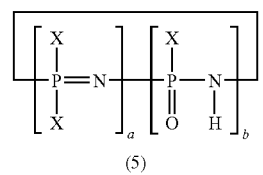

(5)

(wherein a+b=n; n is integer of 3 or more; and X is an aryloxy group and/or an alkoxy group and they may independently be the same or different from each other.)

(B-2) Condensed Phosphoric Ester

As the condensed phosphoric ester suitable in an embodiment of the present invention, various conventional compounds can be used. One of the examples is pentaerythritol diphosphate or phosphoric ester compounds having the following formula (6) or (7).

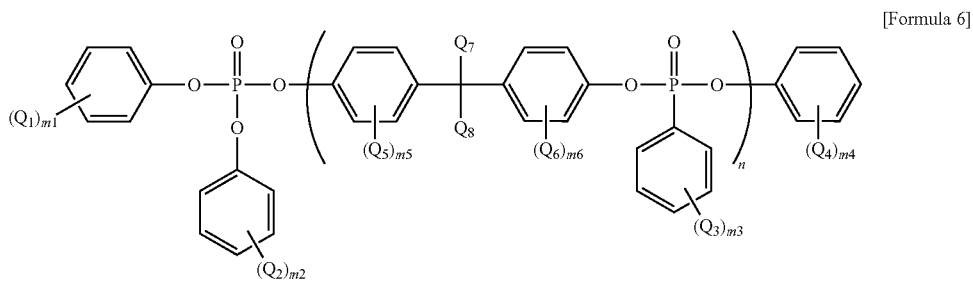

[Formula 6]

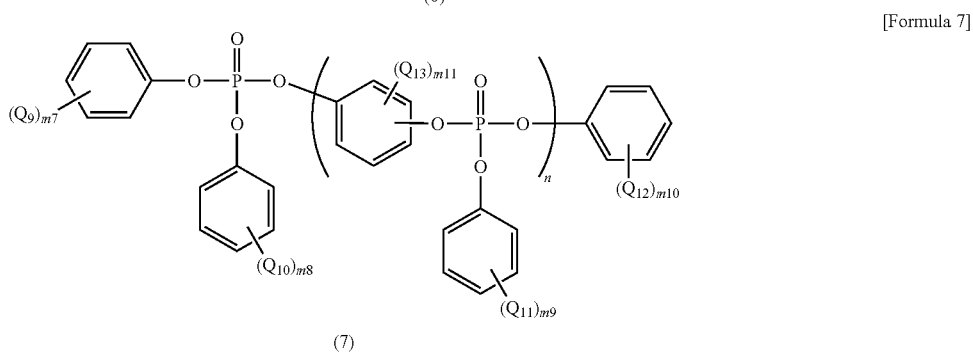

[Formula 7]

(wherein $Q_1, Q_2, Q_3, Q_4, Q_9, Q_{10}, Q_{11}$ and $Q_{12}$ independently represent a hydrogen atom or an alkyl group of 1 to 6 carbon atoms; $Q_5, Q_6, Q_7, Q_8$ and $Q_{13}$ independently represent a hydrogen atom or the methyl group; m1, m2, m3, m4, m7, m8, m9 and m10 independently represent an integer from 0 to 3; m5 and m6 independently represent an integer from 0 to 2; and m11 independently represents an integer from 0 to 4.)

(B-3) Phosphinate

A phosphinate which can be used in an embodiment of the present invention includes at least one selected from the group consisting of a phosphinate represented by the following formula (8) and/or (9), and/or the polymers thereof.

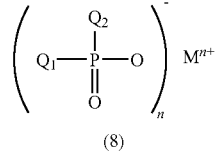

[Formula 8]

(8)

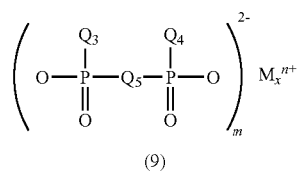

[Formula 9]

(9)

(wherein $Q_1, Q_2, Q_3$ and $Q_4$ represent a hydrogen atom or an alkyl group of 1 to 12 carbon atoms, an alkoxy group of 1 to 12 carbon atoms, an aryl group, and an aryloxy group; $Q_5$ represents at least one group of 1-18 carbon atoms selected from alkylene, aryl alkylene, arylene, alkyl arylene and diarylene; n and m are each an integer of 1-3; x is an integer of 1 or 2; and M represents at least one group selected from a metal atom, an amide, an ammonium group and a melamine derivative, which belong to after the fourth cycle of the periodic table.)

(B-4) Tertiary Phosphines

As the tertiary phosphines that can be used in an embodiment of the present invention, any conventional compounds can be suitably used. From the viewpoint of the balance of thermal resistance, flame retardancy and mechanical properties, 10% weight loss temperature during heating from room temperature to 600° C. at a heating rate of 10° C./min in an inert gas atmosphere according to the TGA measurement, is preferably 150 to 320° C. An example of such tertiary phosphines includes triarylphosphine, trialkylphosphine, triaryloxyphosphine and trialkoxyphosphine. More specifically, among them, triarylphosphines represented by the following formula (10) are suitably used.

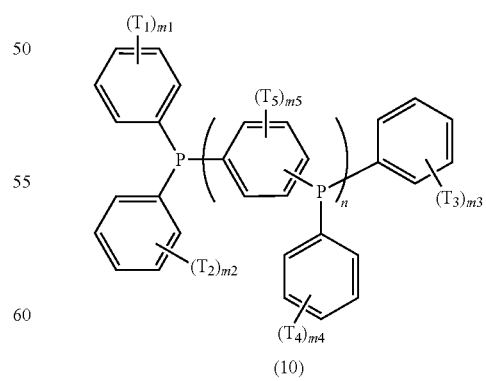

[Formula 10]

(10)

(wherein $T_1, T_2, T_3$ and $T_4$ independently represent a hydrogen atom or an alkyl or aryl group of 1 to 12 carbon atoms; $T_5$ represents a hydrogen atom or a methyl group; m1, m2, m3 and m4 independently represent an integer of 0 to 5; m5 independently represents an integer of 0 to 4; and n represents an integer of 0 to 3. As an aryl group, a naphthyl group can be also suitably used, and the three aryl groups bonded to the phosphorus atom may be all the same group or independently different from one another.)

The water content of phosphor compound (B) suitably used in an embodiment of the present invention is 1000 ppm or less, preferably 800 ppm or less, more preferably 650 ppm or less, furthermore preferably 500 ppm or less, still more preferably 300 ppm or less from the viewpoint of dielectric property, hydrolysis resistance and the like. When it is especially necessary to take into consideration properties such as heat stability upon kneading the phosphor compound with a resin or an effect of imparting flame retardancy, the acid value measured based on JIS K6751 is 1.0 or less, preferably 0.5 or less, more preferably 0.3 or less, particularly preferably 0.1 or less.

The component (B) suitably used in an embodiment of the present invention has a solubility to water of 1000 ppm or less, preferably 500 ppm or less, more preferably 100 ppm or less, further preferably 50 ppm or less, most preferably 25 ppm or less from the viewpoint of hydrolysis resistance and moisture resistance. The solubility to water indicates an amount of a sample dissolved in water when a sample is mixed with distilled water at a concentration of 0.1 g/ml and stirred for an hour at a room temperature.

From the viewpoint of flame retardancy, low smoke evolution during burning, low volatility and the like, which are exhibited upon the use with the component (A), the specific phosphor compound in an embodiment of the present invention advantageously has a temperature difference between 50% weight loss temperature and 5% weight loss temperature of 20 to 150° C., preferably 20 to 120° C. The weight loss temperature is measured by thermogravimetric analysis (TGA) wherein a sample is heated in an inert gas atmosphere from a room temperature to 600° C. at a heating rate of 10° C./min. Moreover, when the phosphor compound is mixed with a resin, the 50% loss in weight temperature is preferably 320 to 500° C., more preferably 350 to 460° C. from the viewpoint of in combustion efficiency achieved by prompt forming of a char layer during burning.

Depending on the kinds and structures of substituents contained therein, the phosphor compound suitably used in embodiments of the present invention can take various forms such as liquid, wax, solid and the like. Any suitable forms can be used so long as the effects of embodiment of the present invention are not damaged.

When it is necessary to consider the thermal resistance of a phosphor compound itself and its low volatility, condensed phosphoric ester, phosphinate and phosphazene compound are suitably used among the phosphor compounds suitably used in an embodiment of the present invention. Preferably used are condensed phosphoric ester synthesized using bisphenol A and phenol as raw materials, condensed phosphoric ester obtained using bisphenol A or resorcin and 2,6-xylenol as raw materials, and phosphazene compound. Moreover, when hydrolysis resistance is further required to be considered, cyclic phosphazene compounds are especially suitably used.

(Mixing Ratio of Flame Retardant Composition)

The mixing ratio of flame retardant composition is not particularly limited so long as the effects of embodiments of the present invention can be achieved. To achieve the effects of embodiments of the present invention effectively, the mixing ratio of the component (A) and the component (B) is composed so that the amount of the component (A) is 1 to 90 parts by weight and the component (B) is 99 to 10 parts by weight relative to 100 parts by weight of the sum of the component (A) and the component (B). Preferably, the amount of the component (A) is 3 to 80 parts by weight and the component (B) is 97 to 20 parts by weight, more preferably the amount of the component (A) is 10 to 80 parts by weight and the component (B) is 90 to 20 parts by weight.

(Shape of Flame Retardant Composition)

The shape of flame retardant composition is not particularly limited so long as the effects of embodiments of the present invention can be achieved. The flame retardant composition is supplied, for example, as a powder, tablets, pellets, blocks, wax, liquid, an oil and the like. Moreover, in the flame retardant composition of the present invention, each component may be completely dissolved with or within each other or simply mixed with one another. Further, the composition can be a mixture of the dissolved component and the simply mixed component.

(Use of Flame Retardant Composition)

The flame retardant composition of embodiments of the present invention can be suitably used in a wide variety of fields, and the method and field of the use are not particularly limited. An example of suitable methods of use includes flame retardants for a resin, rubbers, lubricants, lithium ion batteries, solar batteries, fuel cells, noncompatible electrolytes, battery electrical equipments, demolding agents, demolding film, grooving materials, water-repellents and the like.

(Resin)

The flame retardant composition of embodiments of the present invention can be used in combination with conventional resins. There is no limitation on the resins to be with the composition of the present invention. Any conventional thermoplastic resins and curable resins are suitably used. Such thermoplastic resins include, for example, polycarbonate-based resin, polyphenylene ether-based resin, polyphenylene sulfide-based resin, polypropylene-based resin, polyethylene-based resin, polystyrene-based resin, high-impact polystyrene, elastomer containing polystyrene, syndioctactic polystyrene-based resin, ABS-based resin, AS-based resin, biodegradable resin, polycarbonate-ABS resin alloy, polyalkylene allylate-based resin such as polybutylene terephthalate, polyethylene terephthalate, polypropylene terephthalate, polytrimethylene terephthalate, polyethylene naphthalate and polybutylene naphthalate, polyamide-based resin, thermotropic liquid crystal, polyketone-based resin, and the like. In particular, polyphenylene ether-based resin, polystyrene-based resin, ABS-based resin, polycarbonate-based resin, polyamide-based resin, polyalkylene allylate-based resin, alloy of polyphenylene ether and polystyrene, alloy of polyphenylene ether and polyamide, alloy of polyphenylene ether and thermotropic liquid crystal and alloy of polyphenylene ether and polyphenylene sulfide are suitably used.

The curable resins include unsaturated polyester resin, vinyl ester resin, diallyl phthalate resin, epoxy resin, cyanate resin, xylene resin, triazine resin, urea rein, melamine resin, benzoguanamine resin, urethane resin, oxetane resin, ketone resin, alkide resin, furane resin, styryl pyridine resin, silicon resin, and synthetic rubber. In particular, the epoxy resins are suitably used. The resins used in embodiments of the present invention may be used alone or in combination.

(Polyamide-Based Resin)

As the polyamide-based resin used in embodiments of the present invention, a conventional resin is suitably used and there is no particular limitation thereon.

Monomers used to synthesize the polyamide resins include, as amines, hexamethylene diamine, pentamethylene diamine, 2-methylpentamethylene diamine, octamethylene diamine, 2-methyloctamethylene diamine, nonamethylene diamine, decamethylene diamine, undecamethylene diamine, dodecamethylene diamine, methaxylilene diamine, 2,2,4-trimethyl-1,6-hexane diamine, 2,4,4-trimethyl-1,6-hexane diamine, 2,4-diethyl-1,6-hexane diamine, 2,2-dimethyl-1,7-heptane diamine, 2,3-dimethyl-1,7-heptane diamine, 2,4-dimethyl-1,7-heptane diamine, 2,5-dimethyl-1,7-heptane diamine, 2-methyl-1,8-octane diamine, 3-methyl-1,8-octane diamine, 4-methyl-1,8-octane diamine, 1,3-dimethyl-1,8-octane diamine, 1,4-dimethyl-1,8-octane diamine, 2,4-dimethyl-1,8-octane diamine, 3,4-dimethyl-1,8-octane diamine, 4,5-dimethyl-1,8-octane diamine, 2,2-dimethyl-1,8-octane diamine, 3,3-dimethyl-1,8-octane diamine, 4,4-dimethyl-1,8-octane diamine, 5-methyl-1,9-nonane diamine, isophorone diamine, norbornane dimethylamine, tricyclodecane dimethylamine, and the like. Of these, one or two more types of amines can be used. Further, there can be suitably used, as dicarboxylic acid, adipic acid, octamethylene dicarboxylic acid, malonic acid, succinic acid, glutaric acid, pimelic acid, suberic acid, azelaic acid, sebacic acid, dodecane dicarboxylic acid, dimethyl malonic acid, 3,3-diethyl succinic acid, 2,2-dimethyl glutaric acid, 2-methyl adipic acid, trimethyl adipic acid, 1,3-cyclopentane dicarboxylic acid, 1,4-cyclohexane dicarboxylic acid, terephthalic acid, isophthalic acid, 2,6-naphthalene dicarboxylic acid, 2,7-naphthalene dicarboxylic acid, 1,4-naphthalene dicarboxylic acid, 1,4-phenylenedioxy diacetic acid, 1,3-phenylenedioxy diacetic acid, diphenic acid, 4,4'-biphenyl dicarboxylic acid, 4,4'-oxydibenzoic acid, diphenylmethane-4,4'-dicarboxylic acid, diphenylsulfone-4,4'-dicarboxylic acid, decamethylene dicarboxylic acid, undecamethylene dicarboxylic acid, dodecamethylene dicarboxylic acid, and the like; as amino acid, pentamethylene amino carboxylic acid, decamethylene amino carboxylic acid, undecamethylene amino carboxylic acid, and the like may be used; and as lactams, caprolactam, laurolactam, and the like may be used. These monomers can be used alone or in combination.

The polyamide-based resins obtained by the combination of the above monomers include polyamide 6, polyamide 66, polyamide 66/6, polyamide 46, polyamide 610, polyamide 612, polyamide 11, polyamide 12, polyamide 6I, polyamide 6T, polyamide 9T, polyamide MXD6, polyamide 66/6I, polyamide 66/6T, polyamide 6T/6I, polyamide 66/6I/6, polyamide 66/6I/11, polyamide 66/6I/12, polyamide 66/6I/610, polyamide 66/6I/612, polyamide 10T, polyamide 12T, and the like. These polyamide-based resins can be used in alone or in combination.

A polymerization method of the polyamide-based resin is not particularly limited so long as the method is a general polymerization method of an polyamide. Ordinarily, when the polyamide-based resin is polymerized by a diamine and a dicarboxylic acid, a condensation polymerization reaction is carried out by preparing an equivalent salt of an amine and an acid or adding an amine and an acid separately in an equivalent amount. When the polyamide-based resin is polymerized from a lactam, the condensation polymerization is carried out by adding a small amount of water, amino acid, mineral acid or the like as a ring-opening catalyst. A melt polymerization, in which a polymerization is proceeded with heating a monomer or a monomer solution to remove a water, is used widely in industry. It is well known to add an amine or an acid as a controlling agent of polymerization degree during the polymerization. Further, the polymerization method also includes a method comprising the steps of heating a monomer in the presence of water in a closed vessel to pre-polymerize an oligomer and post-polymerizing the pre-polymerized oligomer in a kneader or an extruder. Depending of types of a monomer, a method wherein a monomer is polymerized with a kneader or an extruder without pre-polymerization of an oligomer can be exemplified.

When the polyamide of the present invention is produced, there can be added phosphoric acid, phosphorous acid, hypophosphorous acid, or salts or esters thereof as a catalyst. The above salts or esters include salts of phosphoric acid, phosphorous acid or hypophosphorous acid and metal salts such as potassium, sodium, magnesium, vanadium, calcium, zinc, cobalt, manganese, tin, tungsten, germanium, titanium, and antimony; ammonium salt of phosphoric acid, phosphorous acid or hypophosphorous acid; and ethyl ester, isopropylester, butyl ester, hexyl ester, isodecyl ester, octadecyl ester, decyl ester, stearyl ester, and phenyl ester of phosphoric acid, phosphorous acid or hypophosphorous acid.

In an embodiment of the present invention, when it is necessary to impart flame retardancy especially effectively and also to impart flowability in good balance, the polyamide-based resin having an aromatic ring component in a main chain at a content of 5 to 75 wt %, preferably 25 to 65 wt %, more preferably 31 to 55 wt %, is suitably used. The content of an aromatic ring component is obtained by the general equation (1).

Content of aromatic ring component(")=(total atomic weight of carbon and hydrogen composing aromatic ring)/(total atomic weight of repeat unit of polyamide)×100(%)     Equation (1)

When the polyamide is a copolyamide, the content is obtained by the general equation (2).

Content of aromatic ring component(")= ""$i \times \alpha i \times 100$(%)     Equation (2)

"i: content of aromatic ring component of i-th copolyamide component

"i: weight fraction of i-th copolyamide component relative to total weight of polyamide The polyamide used in embodiments of the present invention preferably has a polymerization degree, that is, a relative viscosity, in the specific range. The preferable relative viscosity of a semiaromatic polyamide measured according to JIS K 6810 in 98% sulfuric acid at a concentration of 1% at a temperature of 25° C. is 1.5 to 4.0, preferably 1.8 to 3.0. The polyamide is desirable to have an appropriate relative viscosity from the viewpoint of material strength, flowability, moldability, appearance of a molded article, and the like.

The end of the polyamide of embodiments of the present invention may be capped. The end-capping agent is not particularly limited so long as it is a monofunctional compound which is reactive to an amino group or a carboxyl group at a polyamide end. The end sealing agent includes an acid anhydride such as monocarboxylic acid, monoamine and phthalic anhydride, monoisocyanate, mono-acid halide, monoesters, monoalcohols, and the like. From the viewpoint of reactivity stability of capped terminals or the like, monocarboxylic acid or monoamine is preferable. More preferred is a monocarboxylic acid from the view point of easy handling, toxicity or the like.

Monocarboxylic acids to be used as an end-capping agent are not particularly limited as long as they are reactive with amino groups. For example, there can be exemplified aliphatic monocarboxylic acid such as acetic acid, propionic acid, butyric acid, valeric acid, caproic acid, caprylic acid, lauric acid, tridecyl acid, myristic acid, palmitic acid, stearic acid, pivalic acid, and isobutyric acid; alicyclic monocarboxylic acid such as cyclohexane carboxylic acid; aromatic carboxylic acid such as benzoic acid, toluic acid, α-naphthalene carboxylic acid, β-naphthalene carboxylic acid, methylnaphthalene carboxylic acid, and phenylacetic acid. These monocarboxylic acids can be used alone or in combination. Of these, from the viewpoint of reactivity, stability of capped terminals, cost, and the like, acetic acid, propionic acid, butyric acid, valeric acid, caproic acid, caprylic acid, lauric acid, tridecyl acid, myristic acid, palmitic acid, stearic acid and benzoic acid are preferred.

Monoamines to be used as an end-capping agent are not particularly limited as long as they are reactive with carboxylic groups. The monoamines includes, for example, aliphatic monoamines such as methylamine, ethylamine, propylamine, butylamine, hexylamine, octylamine, decylamine, stearyl amine, dimethyl amine, diethylamine, dipropylamine, and dibutyl amine; alicyclic monoamines such as cyclohexylamine and dicyclohexylamine; aromatic monoamines such as aniline, toluidine, diphenylamine and naphthylamine; and the like. These monoamines can be used alone or in combination. Of these, from the viewpoint of reactivity, high boiling point, stability of capped terminals, cost and the like, butylamine, hexylamine, octylamine, decylamine, stearyl amine, cyclohexylamine, and aniline are preferred.

(C-2) Polyalkylene Allylate-Based Resin

As the polyalkylene allylate-based resins, the conventional resins are suitably employed. They includes, for example, polyethylene terephthalate, polypropylene terephthalate, polybutylene terephthalate, polytrimethylene terephthalate, polyethylene naphthalate, polypropylene naphthalate, polybutylene naphthalate, poly-1,4-cyclohexane dimethylene terephthalate, and the like.

The polyalkylenearylate-based resin used in embodiments of the present invention can be obtained by a well known method such as a direct esterification or transesterification using an alkylene glycol and an aromatic dicarboxylic acid or an ester thereof (for instance, terephthalic acid, dimethyl terephthalate, isophthalic acid as a copolymerization element and dimethyl isophthalate).

These polyalkylenearylate-based resins can be used singly or in combination.

(C-3) Polyphenylene Ether-Based Resin

The polyphenylene ether-based resin suitably used in embodiments of the present invention is preferably a homopolymer or a copolymer having a repeat unit represented by the general formula (11) and/or (12).

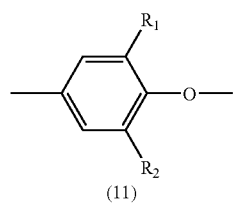

[Formula 11]

(11)

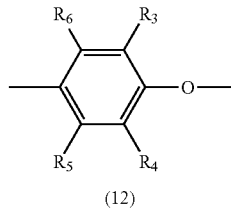

[Formula 12]

(12)

(wherein $R_1$, $R_2$, $R_3$, $R_4$, $R_5$ and $R_6$ independently represent an alkyl group of 1-4 carbon atoms, an aryl group and halogen; with the proviso that $R_5$ and $R_6$ cannot simultaneously be hydrogen.)

Representative examples of homopolymer of polyphenylene ether resins include poly(2,6-dimethyl-1,4-phenylene)ether, poly(2-methyl-6-ethyl-14-phenylene)ether, poly(2,6-diethyl-1,4-phenylene)ether, poly(2-ethyl-6-n-propyl-1,4-phenylene)ether, poly(2,6-di-n-propyl-1,4-phenylene)ether, poly(2-methyl-6-n-butyl-1,4-phenylene)ether, poly(2-ethyl-6-isopropyl-1,4-phenylene)ether, poly(2-methyl-6-hydroxyethyl-1,4-phenylene)ether, and the like.

Among them, poly(2,6-dimethyl-1,4-phenylene) ether is preferred. Especially preferred is polyphenylene ethers disclosed in Japanese Patent Application Laid-Open No. 63-301222, which contain, as a partial structure, 2-(dialkylaminomethyl)-6-methylphenylene ether units, 2-(N-alkyl-N-phenylaminomethyl)-6-methylphenylene ether units or the like.

The polyphenylene ether copolymers are copolymers having a phenylene ether structure as the main monomer unit. Examples of the copolymers include copolymer of 2,6-dimethylphenol and 2,3,6-trimethylphenol; copolymer of 2,6-dimethylphenol and o-cresol; copolymer of 2,6-dimethylphenol, 2,3,6-trimethylphenol and o-cresol; copolymer of 2,6-dimethylphenol and bisphenol represented by the following general formula (13); and the like.

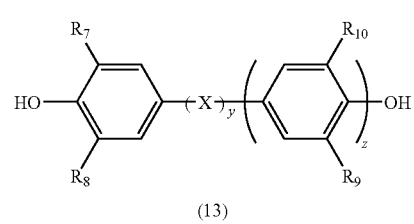

[Formula 13]

(13)

(wherein $R_7$, $R_8$, $R_9$ and $R_{10}$ independently represent an alkyl group of 1-4 carbon atoms, an aryl group or hydrogen; X represents $—C(CH_3)_2—$, $—SO_2—$, $—S—$ or $—O—$; y represents 0 or 1; and z represents 1 or 2.)

In embodiments of the present invention, it is possible to use a modified polyphenylene ether resin in a range where the object of the present invention is not damaged, which is obtained by introducing reactive functional groups such as carboxyl group, epoxy group, amino group, mercapto group, silyl group, hydroxyl group, anhydrous dicarboxylic group into a part or the whole of the polyphenylene ether resin by some methods such as grafting reaction or copolymerization. These can be used singly or in combination.

The modified polyphenylene ether resins obtained by modifying a part or the whole of the polyphenylene ether resin with an unsaturated carboxylic acid or the functional derivatives thereof are disclosed in Japanese Patent Application Laid-Open No. 2-276823, No. 63-108059 and No. 59-59724, and the like. For instance, the modified polyphenylene ether resins can be obtained by melt mixing a polyphenylene ether resin with an unsaturated carboxylic acid or a functional derivative thereof to react in the presence or absence of a radical initiator. Alternatively, the modified resins may be produced by dissolving a polyphenylene ether and an unsaturated carboxylic acid or a functional derivative thereof in an organic solvent in the presence or absence of a radical initiator and reacting them in a solution.

Examples of the unsaturated carboxylic acids or functional derivatives thereof include dicarboxylic acid such as maleic acid, fumaric acid, itaconic acid, halogenated maleic acid, cis-4-cyclohexene-1,2-dicarboxylic acid and endo-cis-bicyclo(2,2,1)-5-heptene-2,3-dicarboxylic acid and the like; acid anhydrides, esters, amides, imides and the like of these carboxylic acids; monocarboxylic acid such as acrylic acid and methacrylic acid and esters, amides and the like of monocarboxylic acid. Moreover, there can be used a saturated carboxylic acid that pyrolytically decomposes itself at a reaction temperature upon production of a modified polyphenylene ether to form functional derivatives used in embodiments of the present invention. Specifically, maleic acid and citric acid are exemplified. These may be used alone or in combination.

The molecular weight of polyphenylene ether which can be used in embodiments of the present invention is not particularly limited so long as the effects of the one or more embodiments of the present invention are not damaged. Concretely, the polyphenylene ether having a number average molecular weight of 500 to 30,000 is preferably used. In the case that a composition particularly excellent in molding processability is required, polyphenylene ether having a number average molecular weight of 500 or more and 5,000 or less, preferably 1,200 or more and 4,000 or less is suitably employed. In the case that a composition particularly excellent in thermal resistance is required, one having a number average molecular weight over 5,000 is suitably employed. According to a property that is especially required as a resin composition, polyphenylene ether having a suitable molecular weight is appropriately employed.

(C-4) Polycarbonate Resin

A polycarbonate resin preferably used in the present invention is a polymer having a repeat unit represented by the following general formula (14).

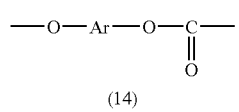

[Formula 14]

(14)

(wherein Ar represents bivalent aromatic-containing group of 4-200 carbon atoms such as phenylene, biphenylene, terphenylene, naphthylene and a group represented by the following general formula (15).

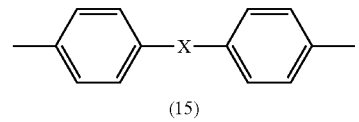

[Formula 15]

(15)

(wherein X represents —O—, —S—, —C(O)—, —C(O)O—, —C(O)NH— and a group represented by the following general formula (16) or (17).

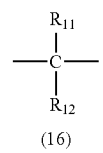

[Formula 16]

(16)

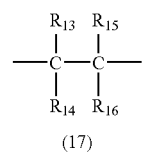

[Formula 17]

(17)

wherein $R_{11}$, $R_{12}$, $R_{13}$, $R_{14}$, $R_{15}$ and $R_{16}$ each independently represent hydrogen atom, an alkyl group of 1-20 carbon atoms or an aryl group, and the hydrogen atom in the substituted group may be substituted by a fluorine atom.)

Moreover, a polycarbonate resin suitably used in embodiments of the present invention may have a branch structure. In addition, a polyorganosiloxane modified polycarbonate-based resin modified with an organosiloxane (for instance, the resin disclosed in such as Japanese Patent Application Laid-Open No. 6-100684 and No. 10-182832) is suitably used, too. These may be used alone or in combination.

A terminal group of a polycarbonate resin is not particularly limited so long as the effects of one or more embodiments of the present invention is achieved. Examples of such terminal groups include alkyl groups, alkyl carbonate groups, aryl groups, aryl carbonate groups and the like. These groups can bond more than a kind of groups as a terminal group.

The molecular weight of a polycarbonate resin which is suitably used in embodiments of the present invention is not particularly limited so long as the effects of one or more embodiments of the present invention is not damaged. Concretely, for example, there is suitably used a polycarbonate resin having a number average molecular weight in polystyrene equivalent of 1,000 to 100,000, preferably 2,000 to 70,000, more preferably 5,000 to 25,000. According to a property that is especially required as a resin composition, a polycarbonate resin having a suitable molecular weight may be appropriately employed.

The polycarbonate resin suitably used in embodiments of the present invention may be produced according to various conventional methods, and the methods are not particularly limited. For example, a polycarbonate resin produced according to phosgene processes or transesterification method is suitably employed.

(C-5) Thermotropic Liquid Crystal

Any thermotropic liquid crystal conventionally known can be used widely as a thermotropic liquid crystal suitably used in embodiments of the present invention, and they are not particularly limited. An example thereof includes a thermotropic liquid crystal polyester having p-hydroxybenzoic acid and ethylene terephthalate as a main constituent unit, a thermotropic liquid crystal polyester having p-hydroxybenzoic acid and 2-hydroxy-6-naphthoic acid as a main constituent unit, a thermotropic liquid crystal polyester having p-hydroxybenzoic acid, 4,4'-hydroxybiphenyl and terephthalic acid as a main constituent unit, and the like. No particular limitation is given.

A thermotropic liquid crystal suitably used in embodiments of the present invention can introduce, as needed, a constituent unit generated from other aromatic dicarboxylic acid, aromatic diol or aromatic hydroxycarboxylic acid in a small amount which does not damage the features and effects of one or more embodiments of the present invention.

A temperature beginning to show the liquid crystalline state while melting the thermotropic liquid crystal of the present invention (hereinafter called a liquid crystal onset temperature) is preferably 150-350° C., more preferably 180-320° C. By controlling the liquid crystal onset temperature in this range, the obtained resin composition exhibits preferable tone and a good balance in thermal resistance and molding processability.

An apparent melt viscosity of the thermotropic liquid crystal suitably used in embodiments of the present invention (liquid crystal onset temperature: +30° C.; shear rate: 100/sec) is not particularly limited so long as the effects of one or more embodiments of the present invention can be obtained. When flowability is especially required, the melt viscosity of the thermotropic liquid crystal is preferably 10 to 3,000 Pa·s, more preferably 10-2,000 Pa·s, particularly preferably 10-1,000 Pa·s.

(Mixing Ratio)

A mixing ratio of the flame retardant composition of embodiments of the present invention and a resin is not particularly limited so long as the effects of one or more embodiments of the present invention can be obtained. It is preferable to incorporate 0.1 to 200 parts by weight of a flame retardant composition of the components (A) and (B) relative to 100 parts by weight of the resin component (C). The component (B) is incorporated in an amount of more preferably 1 to 150 parts, furthermore preferably 5 to 120 parts by weight, relative to 100 parts by weight of the resin component (C).

(Nitrogen-Based Compound)

To the flame retardant composition and flame retardant resin composition of embodiments of the present invention, a nitrogen-containing compound may be further added to enhance the effect of imparting flame retardancy to the flame retardant resin composition containing the specific phenol resin and the phosphor compound (B).

There can be exemplified tertiary amines or quaternary ammonium salt such as triaryl amine, dialkyl arylamine, and alkyl diaryl amine; melamine, melam, melem, mellon, methylene dimelamine, ethylene dimelamine, decamethylene dimelamine, 1,3-cyclohexyl dimelamine, 4,4'-diethylene dimelamine, diethylene tirmelamine, benzoguanamine, dibenzoguanamine, succinoguanamine, methylguanamine, acetoguanamine, melamine resin, and cyanuric acid salt, sulfate, phosphate and organoboronate of the above components; and triazine compounds such as 2-dibutylamino-4,6-dimercapto-S-triazine, 2-N-phenylamino-4,6-dimercapto-S-triazine, 2,4,6-trimercapto-S-triazine, triallyl cyanurate and trimethallyl isocyanurate. When thermal resistance is especially required, triazine-based compounds can be suitably used. Further, when thermostability, volatile resistance or the like is required, there is suitably used melamine condensate such as melam, melem and mellon; or reactants of the above triazine-based compounds and cyanuric acid, especially melamine cyanurate which is a reactant of melamine and cyanuric acid. Moreover, one or more a part or all of the hydrogen groups and/or amino groups of the reactant of triazine-based compound and cyanuric acid may be substituted by the substituents.

The production method of melamine condensate such as melam, melem and mellon suitably used in embodiments of the present invention is not particularly limited. For example, melamine condensate can be obtained by heating melamine or melamine salt in an inert gas atmosphere or under vacuum with or without an organic acid catalyst at 280 to 320° C. to conduct self-condensation.

A melamine cyanurate preferably used in embodiments of the present invention is an equimolar reactant of a melamine and a cyanuric acid. For example, the melamine cyanurate can be obtained as a white solid by agitating and mixing a melamine aqueous solution and a cyanuric acid aqueous solution at a temperature of about 90 to 100° C., and precipitating and filtering products obtained by the reaction. The solid is preferably ground into fine powder for use. The above nitrogen-containing compound can be used alone or in combination. Further, these compounds need not be completely pure, and may contain a small amount of unreactants.

An amount of a nitrogen-based compound added is not limited so long as it is added in such an amount that the effects of one or more embodiments of the present invention can be achieved. The nitrogen-based compounds is preferably added in an amount of 1 to 200 parts by weight, more preferably 5 to 150 parts by weight, further preferably 10 to 120 parts by weight, relative to 100 parts by weight of the sum of the component (A) and the component (B).

(Other Flame Retardants and Flame Retardant Auxiliary)

To the flame retardant composition and flame retardant resin composition of embodiments of the present invention, conventionally known flame retardants or flame retardant auxiliary such as non-halogen or non antimony can be used together in such a range as the effects of one or more embodiments of the present invention can be achieved. For further improvement of flame retardancy, there can be added for instance metal hydroxide such as magnesium hydroxide, aluminum hydroxide, calcium hydroxide and calcium aluminate; boron-containing compounds such as boric acid and zinc borate compounds; silicon-containing compounds such as polyorganosiloxane, silsesquioxane and silicon resin; and inorganic silicon compound such as silica, kaolin clay, talc and wollastonite.

(Filler)

Moreover, conventionally known fillers can be mixed into the flame retardant composition and flame retardant resin composition of embodiments of the present invention in order to improve various characteristics such as mechanical properties. The fillers include silica, kaolin clay, talc, mica, wollastonite, titanium oxide, glass bead, glass flake, glass fiber, calcium carbonate, barium carbonate, calcium sulfate, barium sulfate, calcium silicate, potassium titanate, aluminum borate, magnesium borate, fibrous reinforcing agent such as kenaf fiber, carbon fiber, silica fiber and alumina fiber quartz fiber, and non-fibrous reinforcing agent. These fillers may be used alone or in combination. Further, they may be coated with an organic or inorganic substance.

Moreover, when glass fiber is used as a filler, an appropriate fiber is selected from long-fiber roving, short-fiber chopped strands, milled fiber and the like. It is preferable to use a glass fiber, of which surface is treated so as to suit a resin to be used.

Incorporating a filler, the strength of a non-flammable layer (or a char layer) formed during combustion can be further improved. The layer once formed during combustion is difficult to break and shows a stable heat insulating ability, resulting in higher effect in flame retardancy. Further, high stiffness is imparted to the material.

The amount of a filler mixed is not particularly limited so long as the effects of one or more embodiments of the present invention can be achieved. To achieve the above effects owing to incorporation of a filler effectively, the filler is mixed in an amount of 1-200 parts by weight, preferably 3-150 parts by weight, more preferably 5-120 parts by weight, particularly preferably 10-100 parts by weight, relative to 100 parts by weight of the sum of other than the filler.

(Other Additives)

When the flame retardant composition and the resin composition comprising the flame retardant compositions of embodiments of the present invention are used, there may be preliminarily added other additives in such a range as the effects of the present invention are not damaged in order to impart other characteristics such as stiffness or dimensional stability. The additives include stabilizers such as plasticizers, antioxidants and ultraviolet absorbers, light stabilizer, hardeners, hardening accelerators, antistatic agents, electroconductive agents, stress relaxing agents, releasing agents, crystallization accelerant, hydrolysis restrainer, lubricant, impact imparting agents, slide modifier, compatibilizer, nucleanting agent, strengthening agent, reinforcing agent, flow control agents, dyes, sensitizing agents, pigments for coloration, rubber-like polymers, electroconductive polymers.

(Mixing Method)

The methods for mixing the flame retardant composition with the thermoplastic resin is not particularly limited so long as the effects of one or more embodiments of the present invention can be achieved. For instance, they can be mixed using kneading machines such as extruders, heating rolls, kneaders and Banbury mixers. Among them, melt kneading by an extruder is preferred from the viewpoint of productivity. The temperature of melt kneading may be determined in accordance with a preferred processing temperature of a base resin. A kneading temperature is 140 to 360° C., preferably 180 to 320° C. as a standard.

A molded article of the composition of embodiments of the present invention can be molded by well known methods such as injection molding, sheet molding, blow molding, injection blow molding, inflation molding, extrusion molding, expansion molding and film molding, and also by fabricating molding method such as pneumatic molding and vacuum molding.

Incorporation of a curable resin may be conducted according to a method comprising mixing components used to prepare the resin composition without a solvent or, if necessary, mixing the components with a solvent capable of uniformly mixing them and removing the solvent, to obtain a resin mixture; casting the mixture into a mold to harden followed by cooling; and taking out the resultant molded article from the mold. Alternatively, the resin mixture can be cast into a mold and hardened by a hot press. The solvents for dissolving each component are not particularly limited so long as they can uniformly mix each material and do not damage the effects of one or more embodiments of the present invention. Examples of the solvents include, for example, toluene, xylene, acetone, methyl ethyl ketone, diethyl ketone, cyclopentanone, cyclohexanone, dimethylformamide, methyl cellosolve, methanol, ethanol, n-propanol, iso-propanol, n-butanol, n-pentanol, n-hexanol, cyclohexanol, n-hexane and n-pentane.

In addition, there can be also exemplified a method comprising producing the resin composition by kneading using a kneading machine such as a heating roll, a kneader, a Banbury mixer or an extruder, and then cooling and grinding the resulting composition, followed by molding such as transfer molding, injection molding, compression molding, or the like. The curing method varies depending on the hardener used, but is not particularly limited. For example, heat hardening, light hardening, UV hardening, pressure hardening, moisture hardening, and the like can be mentioned. The curing methods are not limited so long as the effects of the present invention can be attained. The order of mixing the components is not particularly limited so long as the method can attain the effects of one or more embodiments of the present invention. As the method for producing the resin composition, there may be employed a preferred method depending on the suitability for the resin used.

(Usage of Flame Resistance Resin Composition Thing)

The flame retardant resin compositions prepared using the flame retardant composition of embodiments of the present invention are suitably usable for electric and electronic parts such as coil bobbins, fly-back transformers, connectors and deflecting yokes; electric and electronic materials such as printed wiring boards, printed circuit boards, sealers, electrical insulating materials, electrical coating agents, laminated sheets, varnishes for high speed operation, front composite materials, electric wires, aerial materials, cables and high performance molding materials; paints, adhesives, coating materials, tableware, buttons, fiber and paper treating agents, decorative laminates, UV hardening inks, sealants, synthetic leathers, thermal insulating cushioning materials, coating film waterproofing materials, corrosion preventing linings, binders for mold; modifying materials for lacquers, paints and inks; resin modifying materials, aircraft interior parts, matrixes for composite materials, utensils, OA equipment, AV equipment, battery equipment, lighting fixtures, automobile parts, housings, ETC, ITC, portable telephones, etc.

EXAMPLES

Embodiments of the present invention will be explained specifically by the following examples, which should not be construed as limiting the invention in any manner.

(1) GPC Measurement of Phenol Resin (1-1) Measurement of Ratio of High Molecular Weight Phenol Resin and Low Molecular Weight Phenol Resin The measurement of the area fraction of a phenol-based resin with a GPC is conducted using Waters Alliance (manufactured by Nihon Waters K.K.) under the conditions of a hydrofuran solvent, a column temperature of 35° C. and a flow rate of 1 mL/min. For the column, Waters Styragel HR1, HR3 and HR4 (manufactured by Nihon Waters K.K.) are connected in series. As a detector, UV (Waters 2487; wavelength: 254 nm) and/or RI (Waters 2414) are used. The area fraction at a retention time of 6.1 to 9.7 minutes and 9.7 to 11.9 minutes is calculated by the following process. When area enclosed by the GPC chart baseline, the GPC curve at 6.1 to 9.7 minutes and a vertical line drawn from the GPC curve to the GPC chart baseline at a retention time of 9.7 minutes is regarded as area (a'), and the area enclosed by the GPC chart baseline, the GPC curve at 9.7 to 11.9 minutes and a vertical line drawn from the GPC curve to the GPC chart baseline at a retention time of 11.9 minutes is regarded as area (b'), the percentage of (a') in relative to the total of (a') and (b') is regarded as an area fraction (a) and that of (b') is as an area fraction (b). A calibration curve is prepared using standard polystyrene. A molecular weight at a retention time of 9.7 minutes calculated on the basis of the calibration curve was about 870.

(1-2) Measurement of Content of Tri-Nuclear Complex, Bi-Nuclear Complex and Free Monomer Further, the content of the tri-nuclear complex is measured as follows. A peak exhibiting its peak top at around a retention time of 10.0 to 10.1 minutes is regarded as a peak of the tri-nuclear complex with a GPC under the above mentioned condition. The area (S1), which is encompassed with a straight line vertically drawn down from a point showing the lowest absorbance value (Bottom 1) between the peak of the tri-nuclear complex and a peak exhibiting its top peak at around a retention time of 9.8 minutes, a straight line vertically drawn down from a point showing the lowest absorbance value (Bottom 2) between the peak of the tri-nuclear complex and a peak exhibiting its top peak around a retention time of 10.4 minutes, the base line and the GPC curve, is divided with the area (the whole area S2), which is encompassed with the GPC curve and the base line in a retention time of 6.1 to 11.9 minutes, and further is multiplied by 100 to obtain a peak area fraction (%) of the tri-nuclear complex. The thus-obtained valued is regarded as a content of the tri-nuclear complex. Peaks exhibiting its peak top at around a retention time of 10.4 to 10.7 minutes are regarded as a peak of the bi-nuclear complex and at around a retention time of 11.1 to 11.3 minutes are regarded as a peak of a free monomer, respectively, and the each area fraction is calculated. The obtained area fraction of each component is regarded as its content.

(1-3) Weight Average Molecular Weight in Polystyrene Equivalent

The weight average molecular weight in polystyrene equivalent was measured with a GPC under the foregoing conditions.

(2) Flame Retardancy

The flame retardancy was measured on an injection molded test piece having a thickness of about 0.8 mm, about 1.6 mm or about 3.2 mm in accordance with UL-94 vertical flame test, and an average combustion time was obtained when the test piece was allowed to contact flames ten times. Evaluation was conducted on whether or not an absorbent cotton caught fire due to drop the materials during the firing.

(3) Thermal Resistance (DTUL)

The thermal resistance was measured in accordance with ASTM-D-648 on a test piece having a thickness of about 6.4 mm under a load of 18.6 kg.

(4) Flexural Strength

The flexural strength was measured in accordance with ASTM-D-790 on a test piece having a thickness of about 6.4 mm.

(5) Impact Resistance (IZOD)

The impact resistance was measured in accordance with ASTM-D-256 on a test piece (notched) having a thickness of about 6.4 mm.

(6) Appearance of Molded Article

Examples 1 to 5 and Comparative Examples 1 to 7

Molded pieces of about 1.3 mm wide, about 13 mm long and about 3.2 mm thick were prepared using a molding machine IS-80C manufactured by Toshiba Machine Co., Ltd. at a screw temperature of 250° C., a mold temperature of 60° C., an injection time of 10 seconds and a cure time of 15 seconds, and visually evaluated. A molded piece thickly colored was determined as bad, one relatively thickly colored fair, one slightly colored good. Further, a molded piece with surface sink was evaluated as bad, and one without surface sink good.

Examples 15 and 16 and
Comparative Examples 20 to 22

Molded pieces of about 1.3 mm wide, about 13 mm long and about 3.2 mm thick were prepared using a molding machine IS-80C manufactured by Toshiba Machine Co., Ltd. at a screw temperature of 240° C., a mold temperature of 60° C., an injection time of 10 seconds and a cure time of 15 seconds, and visually evaluated. A molded piece thickly colored was determined as bad, one relatively thickly colored fair, one slightly colored good. Further, a molded piece with surface sink was evaluated as bad, and one without surface sink good.

Example 17 and Comparative Examples 23 to 25

Molded piece of about 1.3 mm wide, about 13 mm long and about 3.2 mm thick were prepared using a molding machine IS-80C manufactured by Toshiba Machine Co., Ltd. at a screw temperature of 240° C., a mold temperature of 60° C., an injection time of 10 seconds and a cure time of 15 seconds, and visually evaluated. A molded piece with surface sink was evaluated as bad, and one without surface sink good.

Examples 6 to 10 and Comparative Examples 8 to 15

Molded pieces of about 1.3 mm wide, about 13 mm long and about 0.8 and 1.6 mm thick were prepared using a molding machine PS-40E manufactured by Nissei Plastic Industrial Co., Ltd. at a screw temperature of 270° C., a mold temperature of 80° C., an injection time of 7 seconds and a cure time of 12 seconds, and visually evaluated. A molded piece with a burn mark was evaluated as bad, and one without a burn mark good.

Examples 11 to 14 and
Comparative Examples 16 to 19

Molded pieces of about 1.3 mm wide, about 13 mm long and about 0.8 and 1.6 mm thick were prepared using a molding machine PS-40E manufactured by Nissei Plastic Industrial Co., Ltd. at a screw temperature of 315° C., a mold temperature of 90° C., an injection time of 7 seconds and a cure time of 15 seconds, and visually evaluated. A molded piece thickly colored was determined as bad, one relatively thickly colored fair, one slightly colored good.

(7) Thermal Stability (Mold Deposit: MD)

Examples 6 to 10 and Comparative Examples 8 to 15

Molded pieces of about 128 mm long, about 12.8 mm wide and about 1.6 mm thick were prepared using a molding machine PS-40E manufactured by Nissei Plastic Industrial Co., Ltd. at a cylinder temperature of 270° C. and a mold temperature of 80° C. The surface condition of the mold after 20 shots was visually observed.

Examples 11 to 14 and
Comparative Examples 16 to 19

Molded pieces of about 128 mm long, about 12.8 mm wide, about 1.6 mm thickness were prepared using a molding machine PS-40E manufactured by Nissei Plastic Industrial Co., Ltd. at a cylinder temperature of 315° C. and a mold temperature of 90° C. The surface condition of the mold after 20 shots was visually observed. The surface condition of the mold after 20 shots was visually observed.

Example 17, Comparative Example 21 to 23

The molded piece of about 1.3 mm wide, about 13 mm long and about 3.2 mm thick were prepared using a molding machine IS-80C manufactured by Toshiba Machine Co., Ltd. at a screw temperature of 240° C., a mold temperature of 60° C., an injection time of 10 seconds and a cure time of 15 seconds. The surface condition of the mold after 20 shots was visually observed.
  Good: Less MD observed
  Poor: Much MD observed
The following components were used in Examples and Comparative Examples.

(A) Phenol-Based Resin (A-1) Novolac-type phenol resin: PR-50731 (manufactured by Sumitomo Bakelite Co., Ltd.), (a) 78.0%, (b) 22.0%, Mw: 10366, free monomers: 1.9%, bi-nuclear complex: 8.1%, tri-nuclear complex: 6.0%

(A-2) Novolac-type phenol resin: PR-55307 (manufactured by Sumitomo Bakelite Co., Ltd.), (a) 74.9%, (b) 25.1%, Mw: 3028, free monomers: 0%, bi-nuclear complex: 2.2%, tri-nuclear complex: 6.9%

(A-3) Novolac-type phenol resin: SP-1006N (manufactured by Asahi Organic Chemicals Industry Co., Ltd.), (a) 80.5%, (b) 19.5%, Mw: 7509, free monomers: 1.0%, bi-nuclear complex: 7.2%, tri-nuclear complex: 5.9%

(A-4) Novolac-type phenol resin: PR-53195 (manufactured by Sumitomo Bakelite Co., Ltd.), (a) 73.8%, (b) 26.2%, Mw: 3503, free monomers: 0%, bi-nuclear complex: 10.1%, tri-nuclear complex: 7.8%

(A-5) Novolac-type phenol resin: PR-53647 (manufactured by Sumitomo Bakelite Co., Ltd.), (a) 53.9%, (b) 46.1%, Mw: 1179, free monomers: 0%, bi-nuclear complex: 2.4%, tri-nuclear complex: 22.5%

(A-6) Novolac-type phenol resin: Tamanoru 759 (manufactured by Arakawa Chemical Industries, Ltd.), (a) 63.5%, (b) 36.5%, Mw: 2205, free monomers: 0%, bi-nuclear complex: 14.1%, tri-nuclear complex: 10.0%

(A-7) Novolac-type phenol resin synthesized from phenol and paraformaldehyde, which were used as raw materials, with 5 L autoclave according to the method described in Example 3 of Japanese Patent Application Laid-Open No. 2000-273133: (a) 98.2%, (b) 1.8%, Mw: 883,582, free monomers: 0%, bi-nuclear complex: 0.3%, tri-nuclear complex: 1.1%

(B) Phosphorus Compound (B-1) Phenoxyphosphazene represented by the following formula (18) containing 93.6 wt % of n=3, 4.0 wt % of n=4 and 2.4 wt % of n≧5.

5% weight loss temperature: 336° C., 50% weight loss temperature: 398° C., Amount of residue at 500° C.: 4.7 wt %, Acid value: 0.17, water content: 182 ppm

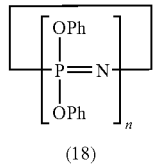

[Formula 18]

(18)

(B-2) Triphenyl phosphate (TPP)

(B-3) Condensed phosphoric ester synthesized from resorcin and 2,6-xylenol, which were used as raw materials: PX-200 (manufactured by Daihachi Chemical Industry Co., Ltd.)

(Nitrogen-Based Compound)

Melamine cyanurate (MCA C-0; manufactured by Mitsubishi Chemical Co., Ltd.)

(C) Resin (1) Polybutylene Terephthalate

DURANEX 2002® (manufactured by Win Tech Polymer Ltd.)

(2) Polycarbonate Resin (PC)

Caliber® 301-10 (manufactured by Sumitomo Dow Ltd.)

(3) Acrylonitrile-Butadiene-Styrene Resin (ABS)

M8801 (manufactured by company UMG ABS Ltd.)

(4) Polyphenylene Ether (PPE)

Poly-2,6-dimethyl-1,4-phenylene ether having "sp/c of 0.54 measured in a chloroform solution at 30° C.

(5) Polyamide Resin (PA66)

Leona® 1300S (manufactured by Asahi Kasei Chemicals Corp.)

(PA-MXD6)

Polyamide MXD6 resin (Reny® 6002; manufactured by Mitsubishi Gas Chemical Company, Inc.)

(PA12T)

664 g (4.0 mol) of terephthalic acid, 802 g (4.0 mol) of 1,12-dodecanediamine, 1.95 g (0.016 mol) of benzoic acid, 0.148 g (0.0014 mol) of sodium hypophosphite monohydrate and 1500 g of distilled water were charged into an autoclave having an inner volume of 5.0 L, and the internal gas in the autoclave was substituted with nitrogen gas. The internal temperature of the autoclave was risen to 240° C. over 1.5 hours with stirring. At this time, the internal pressure of the autoclave was risen to 3.0 MPa. After that, the temperature of the autoclave was lowered to 290° C. by gradually discharging water vapor from the autoclave while maintaining the internal pressure 3.0 MPa. Then, the internal pressure was reduced to normal pressure by gradually discharging water vapor from the autoclave over 75 minutes to obtain a polymer from a discharge valve of the autoclave. The resultant powdered polymer was dried in a nitrogen flow at 90° C. for 24 hours. ηr=2.5

(PA10T)

664 g (4.0 mol) of terephthalic acid, 690 g (4.0 mol) of 1,10-decanediamine, 2.92 g (0.024 mol) of benzoic acid, 0.135 g (0.0013 mol) of sodium hypophosphite monohydrate and 1400 g of distilled water were charged into an autoclave having an inner volume of 5.0 L, and the internal gas in the autoclave was substituted with nitrogen gas. The internal temperature of the autoclave was risen to 260° C. over 1.5 hours with stirring. At this time, the internal pressure of the autoclave was risen to 4.0 MPa. After that, the temperature of the autoclave was lowered to 320° C. by gradually discharging water vapor from the autoclave while maintaining the internal pressure 4.0 MPa. Then, the internal pressure was lowered to normal pressure over 90 minutes to obtain a polymer from a discharge valve of the autoclave. The resultant powdered polymer was dried in a nitrogen flow at 90° C. for 24 hours. ηr=2.6

(PA9T)

664 g (4.0 mol) of terephthalic acid, 633 g (4.0 mol) of 1,9-nonanediamine, 2.92 g (0.024 mol) of benzoic acid, 0.13 g (0.0012 mol) of sodium hypophosphite monohydrate and 1400 g of distilled water were charged into a autoclave having an inner volume of 5.0 L, and the internal gas in the autoclave was substituted with nitrogen gas. The internal temperature of the autoclave was risen to 260° C. over 1.5 hours with stirring. At this time, the internal pressure of the autoclave was risen to 4.0 MPa. After that, the temperature of the autoclave was lowered to 320° C. by gradually discharging water vapor from the autoclave while maintaining the internal pressure 4.0 MPa. Then, the internal pressure was lowered until normal pressure over 90 minutes to obtain a polymer from a discharge valve of the autoclave. The resultant powdered polymer was dried in a nitrogen flow at 90° C. for 24 hours. The dried polymer was a yellow solid. ηr=2.7, [COOH]=52 mg equivalent/kg (6) Rubber-Reinforced Polystyrene (HIPS)

Rubber-reinforced polystyrene having a rubber content of 9%, matrix polystyrene ηsp/c of 0.64, measured in a toluene solution, and volume average particle size of 1.5 μm (7) Polystyrene (GPPS)

Polystyrene having ηsp/c of 0.8, measured in a toluene solution (8) PTFE

PTFE 6C-J (DuPont-Mitsui Fluorochemicals Co., Ltd.)

(D) Filler (Glass Fiber)

T-275 (Nippon Electric Glass Co., Ltd)

Examples 1 to 14 and Comparative Examples 1 to 19

A ZSK-25 biaxial rotation extruder (manufactured by Werner Pfleiderer) equipped with one feed opening at upstream side and downstream side, respectively, was used. The temperature of heating cylinder of the extruder was adjusted to the following temperature. Each of the components other than GF was fed from the upstream side opening at a ratio shown in Tables 1 to 8, and GF was fed from the downstream side opening at a ratio of Tables 1 to 8. The fed components were melt mixed at a screw rotation speed of 300 rpm. The resultant strands were cooled and cut to obtain resin composition pellets.

Tables 1 to 3 PBT resin: cylinder temperature of 250° C.

Tables 4 to 6 PA66 resin: cylinder temperature of 275° C.

Tables 7 and 8 PA9T,10T,12T resin: cylinder temperature of 315° C.

Then, the resultant resin composition pellets were molded using an injection molding machine to prepare test pieces for physical property evaluation. Physical property tests were conducted according to the test methods mentioned above. The test results are shown in Tables 1 to 8.

TABLE 1

|  |  | Ex. 1 | Ex. 2 | Ex. 3 | Ex. 4 | Ex. 5 |
|---|---|---|---|---|---|---|
| PBT (A) | wt. part | 41.3 | 43.6 | 41.3 | 41.3 | 36.8 |
| Phenol-based resin |  | (A-1) | (A-1) | (A-2) | (A-3) | (A-2) |
| Added amount (B) | wt. part | 14.3 | 12.0 | 14.3 | 14.3 | 13.3 |
| (B-1) | wt. part | 9.3 | 9.3 | 9.3 | 9.3 | — |
| (B-2) | wt. part | — | — | — | — | — |
| (B-3) | wt. part | — | — | — | — | 13.8 |
| GF | wt. part | 30.0 | 30.0 | 30.0 | 30.0 | 30.0 |
| MCA | wt. part | 4.6 | 4.6 | 4.6 | 4.6 | 4.6 |
| PTFE | wt. part | 0.5 | 0.5 | 0.5 | 0.5 | 0.5 |
| [UL-94] 1.59 mm |  | V-0 | V-0 | V-0 | V-0 | V-0 |
| Average combustion time | sec | 1.6 | 3.9 | 2.2 | 4.0 | 3.1 |
| Maximum firing time | sec | 2.5 | 8.2 | 5.7 | 9.6 | 6.3 |
| Flexural strength | kg/cm$^2$ | 1458 | 1508 | 1325 | 1261 | 1266 |
| DTUL | ° C. | 183 | 189 | 183 | 180 | 175 |
| IZOD | kg · cm/cm | 4.3 | 4.3 | 4.2 | 4.2 | 4.1 |
| Appearace of molded article |  |  |  |  |  |  |
| Coloring |  | good | good | good | good | good |
| Surface sink |  | good | good | good | good | good |

TABLE 2

|  |  | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|---|
| PBT (A) | wt. part | 41.3 | 41.3 | 41.3 | 41.3 | 41.3 | 36.8 | 47.6 |
| Phenol-based resin |  | (A-4) | (A-5) | (A-6) | (A-7) | (A-1) | (A-2) | (A-1) |
| Added amount (B) | wt. part | 14.3 | 14.3 | 14.3 | 14.3 | 14.3 | 13.3 | 16.5 |
| (B-1) | wt. part | 9.3 | 9.3 | 9.3 | 9.3 | — | — | — |
| (B-2) | wt. part | — | — | — | — | 9.3 | 13.8 | — |
| (B-3) | wt. part | — | — | — | — | — | — | — |
| GF | wt. part | 30.0 | 30.0 | 30.0 | 30.0 | 30.0 | 30.0 | 30.0 |
| MCA | wt. part | 4.6 | 4.6 | 4.6 | 4.6 | 4.6 | 4.6 | 5.3 |
| PTFE | wt. part | 0.5 | 0.5 | 0.5 | 0.5 | 0.5 | 0.5 | 0.6 |
| [UL-94] 1.59 mm |  | V-1 | V out | V out | V out | V-1 | V-1 | V out |
| Av. combustion time | sec | 6.9 | 12.5 | 10.4 | 14.8 | 7.4 | 6.4 | 25.2 |
| Max. combustion time | sec | 16.0 | 43.2 | 32.5 | 38.5 | 13.1 | 15.6 | 69.4 |
| Flexural strength | kg/cm$^2$ | 1174 | 1126 | 1147 | 1112 | 1328 | 1143 | — |
| DTUL | °C. | 178 | 170 | 172 | 202 | 179 | 170 | — |
| IZOD | kg·cm/cm | 4.1 | 3.9 | 3.9 | 1.8 | 4.1 | 4.1 | — |
| Appearace of molded article |  |  |  |  |  |  |  |  |
| Coloring |  | fair | fair | fair | poor | fair | fair | — |
| Surface sink |  | poor | poor | poor | good | poor | poor | — |

TABLE 3

|  |  | Ex. 1 | Ex. 3 | Ex. 5 | Comp. Ex. 1 | Comp. Ex. 2 | Comp. Ex. 4 |
|---|---|---|---|---|---|---|---|
| PBT (A) | wt. part | 41.3 | 41.3 | 36.8 | 41.3 | 41.3 | 41.3 |
| Phenol-based resin |  | (A-1) | (A-2) | (A-2) | (A-4) | (A-5) | (A-1) |
| Added amount (B) | wt. part | 14.3 | 14.3 | 13.3 | 14.3 | 14.3 | 14.3 |
| (B-1) | wt. part | 9.3 | 9.3 | — | 9.3 | 9.3 | — |
| (B-2) | wt. part | — | — | — | — | — | 9.3 |
| (B-3) | wt. part | — | — | 13.8 | — | — | — |
| GF | wt. part | 30.0 | 30.0 | 30.0 | 30.0 | 30.0 | 30.0 |
| MCA | wt. part | 4.6 | 4.6 | 4.6 | 4.6 | 4.6 | 4.6 |
| PTFE | wt. part | 0.5 | 0.5 | 0.5 | 0.5 | 0.5 | 0.5 |
| [UL-94] 0.79 mm |  | V-0 | V-0 | V-1 | V-1 | V-2 | V-1 |
| Av. combustion time | sec | 3.5 | 3.6 | 3.3 | 6.1 | 13.0 | 8.2 |
| Max. combustion time | sec | 8.4 | 7.4 | 10.1 | 18.4 | 21.7 | 15.2 |

TABLE 4

|  |  | Ex. 6 | Ex. 7 | Ex. 8 | Comp. Ex. 8 |
|---|---|---|---|---|---|
| PA66 (A) | wt. part | 41.9 | 41.9 | 41.9 | 41.9 |
| Phenol-based resin |  | (A-1) | (A-2) | (A-3) | (A-1) |
| Added amount (B) | wt. part | 14.0 | 14.0 | 14.0 | 14.0 |
| (B-1) | wt. part | 14.0 | 14.0 | 14.0 | — |
| (B-2) | wt. part | — | — | — | 14.0 |
| GF | wt. part | 25.0 | 25.0 | 25.0 | 25.0 |
| MCA | wt. part | 4.6 | 4.6 | 4.6 | 4.6 |
| PTFE | wt. part | 0.5 | 0.5 | 0.5 | 0.5 |
| [UL-94] 0.79 mm |  | V-0 | V-0 | V-1 | V-2 |
| Number of cotton ignition |  | 0/5 | 0/5 | 0/5 | 2/5 |
| Av. combustion time | sec | 4.0 | 4.7 | 4.8 | 9.1 |
| Max. combustion time | sec | 9.0 | 8.9 | 10.4 | 21.2 |
| Appearace of molded article |  |  |  |  |  |
| Burn mark |  | good | good | good | poor |
| Thermal stability |  |  |  |  |  |
| MD |  | good | good | good | poor |

TABLE 5

|  |  | Comp. Ex. 9 | Comp. Ex. 10 | Comp. Ex. 11 | Comp. Ex. 12 | Comp. Ex. 13 |
|---|---|---|---|---|---|---|
| PA66 (A) | wt. part | 41.9 | 41.9 | 41.9 | 41.9 | 41.9 |
| Phenol-based resin |  | (A-4) | (A-5) | (A-6) | (A-7) | (A-1) |
| Added amount (B) | wt. part | 14.0 | 14.0 | 14.0 | 14.0 | 14.0 |
| (B-1) | wt. part | 14.0 | 14.0 | 14.0 | 14.0 | — |
| (B-2) | wt. part | — | — | — | — | 14.0 |
| GF | wt. part | 25.0 | 25.0 | 25.0 | 25.0 | 25.0 |
| MCA | wt. part | 4.6 | 4.6 | 4.6 | 4.6 | 4.6 |
| PTFE | wt. part | 0.5 | 0.5 | 0.5 | 0.5 | 0.5 |
| [UL-94] 0.79 mm |  | V out | V-2 | V-2 | V-2 | V-2 |
| Number of cotton ignition |  | 5/5 | 5/5 | 5/5 | 5/5 | 2/5 |
| Av. combustion time | sec | 10.3 | 7.3 | 8.2 | 7.9 | 9.1 |
| Max. combustion time | sec | 31.5 | 29.4 | 24.7 | 18.4 | 21.2 |
| Appearace of molded article |  |  |  |  |  |  |
| Burn mark |  | poor | poor | poor | good | poor |
| Thermal stability |  |  |  |  |  |  |
| MD |  | poor | poor | poor | good | poor |

TABLE 6

|  |  | Ex. 9 | Ex. 10 | Comp. Ex. 14 | Comp. Ex. 15 |
|---|---|---|---|---|---|
| PA66 | wt. part | 31.9 | 31.9 | 31.9 | 31.9 |
| MDX6 (A) | wt. part | 10 | 10 | 10 | 10 |
| Phenol-based resin |  | (A-1) | (A-2) | (A-4) | (A-5) |
| Added amount (B) | wt. part | 14.0 | 14.0 | 14.0 | 14.0 |
| (B-1) | wt. part | 14.0 | 14.0 | 14.0 | 14.0 |
| GF | wt. part | 25.0 | 25.0 | 25.0 | 25.0 |
| MCA | wt. part | 4.6 | 4.6 | 4.6 | 4.6 |
| PTFE | wt. part | 0.5 | 0.5 | 0.5 | 0.5 |
| [UL-94] 0.79 mm |  | V-0 | V-0 | V-2 | V-2 |
| Number of cotton ignition |  | 0/5 | 0/5 | 5/5 | 5/5 |
| Av. combustion time | sec | 1.8 | 3.4 | 5.0 | 7.2 |
| Max. combustion time | sec | 3.5 | 7.2 | 12.1 | 18.7 |
| Appearace of molded article |  |  |  |  |  |
| Burn mark | | good | good | good | poor |
| Thermal stability |  |  |  |  |  |
| MD |  | good | good | poor | poor |

TABLE 7

|  |  | Ex. 11 | Ex. 12 | Comp. Ex. 16 | Ex. 13 | Comp. Ex. 17 |
|---|---|---|---|---|---|---|
| PA12T | wt. part | 47.9 | 47.9 | 47.9 | — | — |
| PA10T (A) | wt. part | — | — | — | 47.9 | 47.9 |
| Phenol-based resin |  | (A-1) | (A-2) | (A-5) | (A-2) | (A-5) |
| Added amount (B) | wt. part | 12.0 | 12.0 | 12.0 | 12.0 | 12.0 |
| (B-1) | wt. part | 10.0 | 10.0 | 10.0 | 10.0 | 10.0 |
| (B-2) | wt. part | — | — | — | — | — |
| GF | wt. part | 25.0 | 25.0 | 25.0 | 25.0 | 25.0 |
| MCA | wt. part | 4.6 | 4.6 | 4.6 | 4.6 | 4.6 |
| PTFE | wt. part | 0.5 | 0.5 | 0.5 | 0.5 | 0.5 |
| [UL-94] 0.79 mm |  | V-0 | V-0 | V-2 | V-0 | V-2 |
| Av. combustion time | sec | 1.9 | 3.2 | 6.6 | 3.8 | 6.9 |
| Max. combustion time | sec | 4.4 | 9.1 | 12.6 | 8.2 | 15.2 |
| Thermal stability |  |  |  |  |  |  |
| MD |  | good | good | poor | good | poor |
| Appearance of molded article |  |  |  |  |  |  |
| Coloring |  | good | good | fair | good | fair |
| Burn mark |  | good | good | poor | good | poor |

TABLE 8

|  |  | Ex. 14 | Comp. Ex. 18 | Comp. Ex. 19 |
|---|---|---|---|---|
| PA9T | wt. part | 47.9 | 47.9 | 47.9 |
| (A) |  |  |  |  |
| Phenol-based resin |  | (A-1) | (A-5) | (A-1) |
| Added amount | wt. part | 12.0 | 12.0 | 12.0 |
| (B) |  |  |  |  |
| (B-1) | wt. part | 10.0 | 10.0 | — |
| (B-2) | wt. part | — | — | 10 |
| GF | wt. part | 25.0 | 25.0 | 25.0 |
| MCA | wt. part | 4.6 | 4.6 | 4.6 |
| PTFE | wt. part | 0.5 | 0.5 | 0.5 |
| [UL-94] 0.79 mm |  | V-0 | V-2 | V out |
| Average firing time | sec | 2.5 | 7.4 | 13.2 |
| Max. combustion time | sec | 6.7 | 14.9 | 32.9 |
| Extrusion bleed |  | good | poor | poor |
| Appearance of molded article |  |  |  |  |
| Coloring |  | good | fair | fair |
| Burn mark |  | good | poor | poor |

Examples 15 to 17 and Comparative Examples 20 to 25

A ZSK-25 biaxial rotation extruder (manufactured by Werner Pfleiderer) was used. The temperature of heating cylinder of the extruder was adjusted to 250° C. Each of the components was fed at a ratio shown in Tables 9 and 10 and melt mixed at a screw rotation speed of 300 rpm. The resultant strands were cooled and cut to obtain resin composition pellets.

Then, the resultant resin composition pellets were molded using an injection molding machine to prepare test pieces for physical property evaluation. Physical property tests were conducted according to the test methods mentioned above. The test results are shown in Tables 9 and 10.

TABLE 9

|  |  | Ex. 15 | Comp. Ex. 20 | Ex. 16 | Comp. Ex. 21 | Comp. Ex. 22 |
|---|---|---|---|---|---|---|
| PC | wt. part | 80.0 | 80.0 | 80.0 | 80.0 | 80.0 |
| ABS | wt. part | 20.0 | 20.0 | 20.0 | 20.0 | 20.0 |
| (A) |  |  |  |  |  |  |
| Phenol-based resin |  | (A-1) | (A-5) | (A-1) | (A-1) | (A-1) |
| Added amount | wt. part | 3.0 | 3.0 | 3.0 | — | — |
| (B) |  |  |  |  |  |  |
| (B-1) | wt. part | 8.0 | 8.0 | 8.0 | 8.0 | — |
| (B-2) | wt. part | — | — | — | — | 8.0 |
| PTFE | wt. part | — | — | 0.5 | — | 0.5 |
| [UL-94] 3.18 mm |  | V-0 | V-1 | V-0 | V-1 | V-1 |
| Av. combustion time | sec | 4.4 | 8.9 | 3.8 | 6.1 | 10.3 |
| Max. combustion time | sec | 9.2 | 24.3 | 6.5 | 18.2 | 26.3 |
| Thermal stability |  |  |  |  |  |  |
| MD | | good | good | good | good | poor |
| Appearance of molded article |  |  |  |  |  |  |
| Coloring |  | good | good | good | good | good |
| Surface sink |  | good | poor | good | good | poor |

TABLE 10

|  |  | Ex. 17 | Comp. Ex. 23 | Comp. Ex. 25 |
|---|---|---|---|---|
| PPE | wt. part | 40.0 | 40.0 | 40.0 |
| PS | wt. part | 15.0 | 15.0 | 15.0 |
| HIPS | wt. part | 30.0 | 30.0 | 30.0 |
| (A) |  |  |  |  |
| Phenol-based resin |  | (A-1) | (A-5) | (A-1) |
| Added amount | wt. part | 5.0 | 5.0 | 5.0 |
| (B) |  |  |  |  |
| (B-1) | wt. part | 10 | 10 | — |
| (B-2) | wt. part | — | — | 10 |
| PTFE | wt. part | — | — | — |
| [UL-94] 3.18 mm |  | V-0 | V-1 | V-1 |
| Av. combustion time | sec | 3.0 | 5.6 | 6.1 |
| Max. combustion | sec | 6.0 | 12.2 | 18.2 |
| DTUL | ° C. | 99 | 94 | 96 |
| IZOD | kg · cm/cm | 6.4 | 5.8 | 7.2 |
| Thermal stability |  |  |  |  |
| MD |  | good | poor | poor |
| Appearance of molded article |  |  |  |  |
| Surface sink |  | good | poor | poor |

Tables 1 to 10 show that a combination of phenol resin satisfying a specific condition and phosphor compound other than non-condensed phosphoric ester can impart excellent flame retardancy to the resin composition. In addition, the combination can impart thermal resistance, impact resistance, mechanical strength, moldability and thermal resistance to the resin composition, and provide a molded article with excellent appearance.

INDUSTRIAL APPLICABILITY

The flame retardant composition comprising a specific phenolic-based resin (A) and a specific phosphor compound (B) exhibits excellent flame retardancy, thermal resistance, extrusion workability, mold releasability, thermal stability, mechanical properties, processability and the like, particularly when added to a resin. Therefore, the composition is suitably usable for flame retardant for a resin, rubber, lubricants, lithium-ion batteries, solar batteries, fuel cells, non-flammable electrolytic solutions, battery equipments, demolding agent, demolding film, rough grooving materials, water-repellant medicine and the like. In addition, the flame retardant resin compositions prepared using the flame retardant composition of embodiments of the present invention are suitably usable for electric and electronic parts such as coil bobbins, fly-back transformers, connectors and deflecting yokes; electric and electronic materials such as printed wiring boards, printed circuit boards, sealers, electrical insulating materials, electrical coating agents, laminated sheets, varnishes for high speed operation, front composite materials, electric wires, aerial materials, cables and high performance molding materials; paints, adhesives, coating materials, tableware, buttons, fiber and paper treating agents, decorative laminates, UV hardening inks, sealants, synthetic leathers, thermal insulating cushioning materials, coating film waterproofing materials, corrosion preventing linings, binders for mold, modifying materials for lacquers, paints and inks, resin modifying materials, aircraft interior parts, matrixes for composite materials, utensils, OA equipment, AV equipment, battery equipment, lighting fixtures, automobile parts, housings, ETC, ITC, portable telephones, etc.

Figure 1:
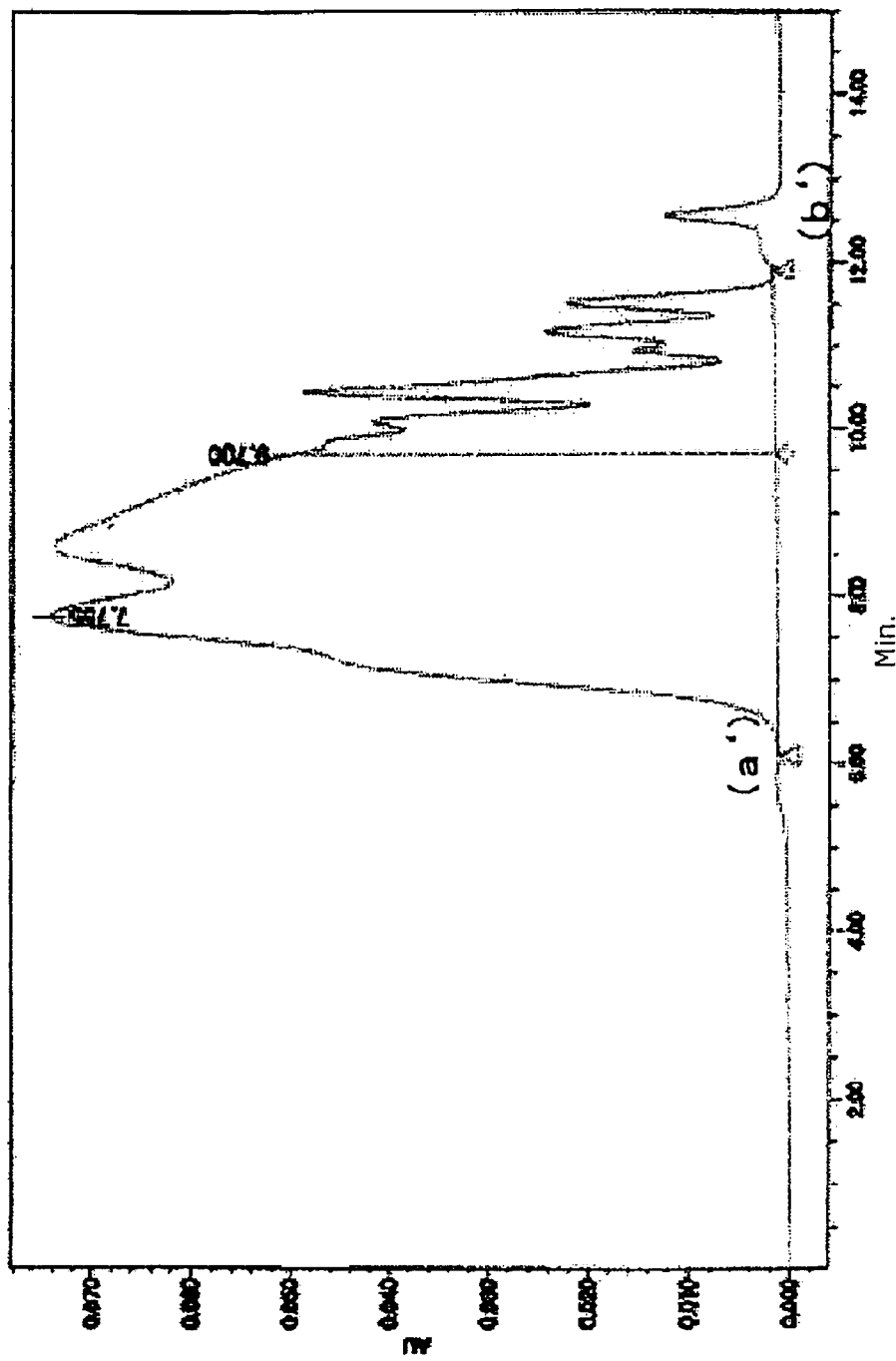
FIG. 1 GPC spectrum of the phenol resin (A-1)
FIG. 2 GPC spectrum of the phenol resin (A-2)
FIG. 3 GPC spectrum of the phenol resin (A-4)
FIG. 4 GPC spectrum of the phenol resin (A-5)
Figure 2:
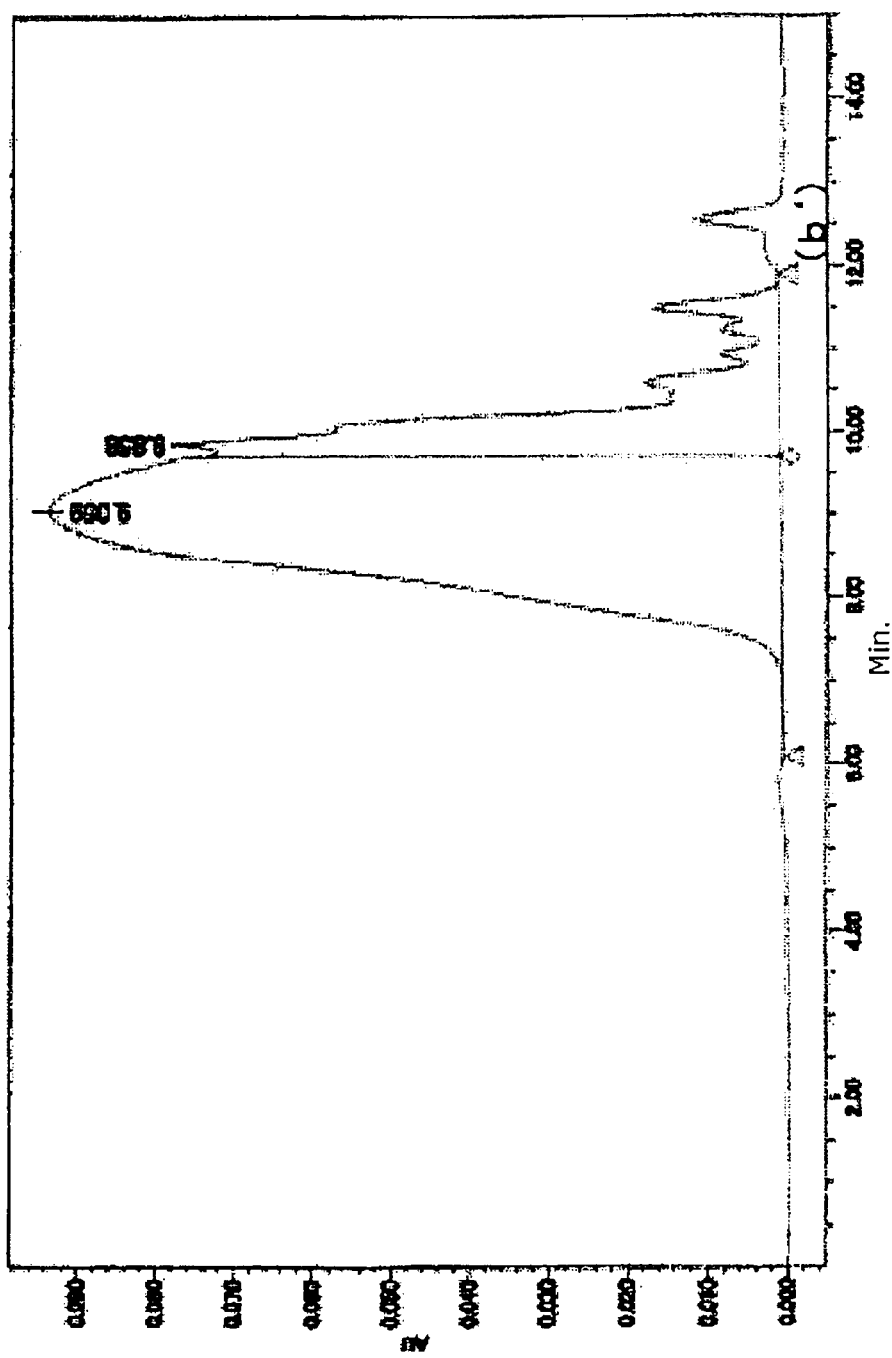
Figure 3:
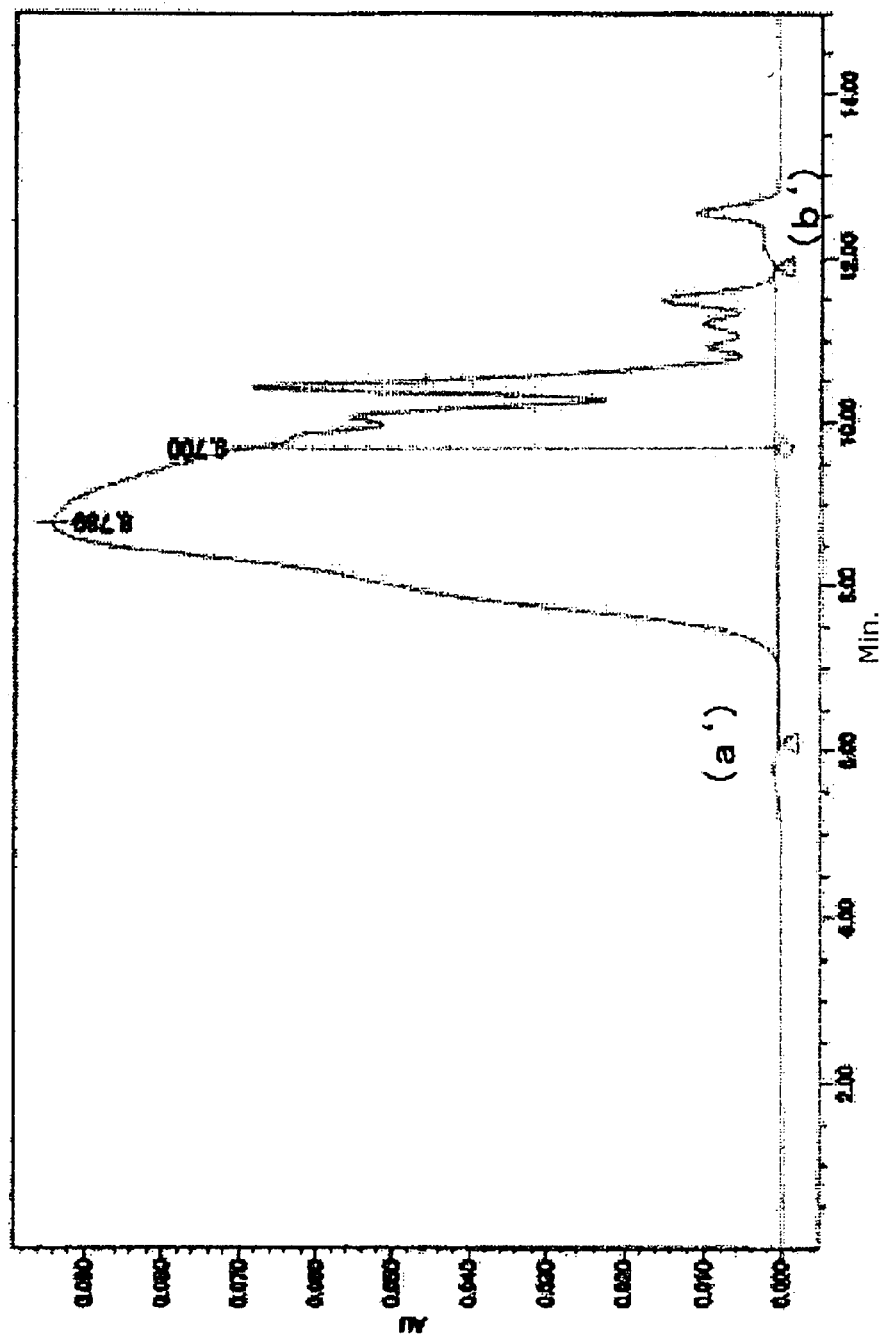

The invention claimed is:

1. A flame retardant composition comprising:
    (A) a phenol-based resin which has an area fraction (a) with a weight average molecular weight in polystyrene equivalent of 870 or more and an area fraction (b) with a weight average molecular weight in polystyrene equivalent of less than 870, the area fraction (a) being 74% or more and 98% or less based on the total 100% of the area fractions (a) and (b), and has a weight average molecular weight in polystyrene equivalent of 2,000 to 80,000, the weight average molecular weight in polystyrene equivalent being measured with a gel permeation chromatography using a tetrahydrofuran as a solvent at a column temperature of 35° C. at a flow rate of 1 mL/min; and
    (B) a phosphor compound (excluding non-condensed phosphoric ester) comprising a phosphazene compound with a cyclic trimer content of 76 wt % or more,
    wherein the component (A) is a novolac-type phenol resin that contains a tri-nuclear complex component in an amount of 7% or less.

2. The flame retardant composition according to claim 1, characterized in that the component (A) contains a bi-nuclear complex component in an amount of 10% or less.

3. The flame retardant composition according to claim 1, characterized in that the component (B) further comprises at least one member selected from the group consisting of condensed phosphoric ester and phosphinate.

4. The flame retardant composition according to claim 1, characterized in that component (B) further comprises a condensed phosphoric ester.

5. The flame retardant composition according to claim 1, characterized in that the component (B) further comprises a phosphazene compound with a cyclic tetramer content of 80 wt % or more.

6. A flame retardant composition comprising:
    (A) a novolac-type phenol-based resin which has an area fraction (a) with a weight average molecular weight in polystyrene equivalent of 870 or more and an area fraction (b) with a weight average molecular weight in polystyrene equivalent of less than 870, the area fraction (a) being 74% or more and 98% or less based on the total 100% of the area fractions (a) and (b), has a weight average molecular weight in polystyrene equivalent of 2,000 to 80,000, the weight average molecular weight in polystyrene equivalent being measured with a gel permeation chromatography using a tetrahydrofuran as a solvent at a column temperature of 35° C. at a flow rate of 1 mL/min, has a content of a tri-nuclear complex composition of 7% or less; and
    (B) at least one phosphor compound selected form the group consisting of condensed phosphoric ester and phosphazene compound with a cyclic trimer content of 76 wt % or more.

7. The flame retardant composition according to claim 1, characterized in that the composition further incorporates nitrogen-containing compound.

8. The flame retardant composition according to claim 7, characterized in that the nitrogen-containing compound is triazine-based compound.

9. The flame retardant composition according to claim 1, characterized in that the contents of the components (A) and (B) are 1 to 90 parts by weight and 10 to 99 parts by weight, respectively, relative to the total of 100 parts by weight of the components (A) and (B).

10. The flame retardant composition according to claim 1, further comprising a resin (C) different from the phenol-based resin (A).

11. The resin composition according to claim 10, characterized in that the content of the flame retardant composition (the total of the components (A) and (B)) is 0.1 to 200 parts by weight relative to 100 parts by weight of the resin (C).

12. The resin composition according to claim 10, characterized in that the resin (C) comprises at least one member selected from the group consisting of polyphenylene ether-based resin, polystyrene-based resin, polyalkylene allylate-based resin, polyamide-based resin, polycarbonate-based resin, polyphenylene sulfide-based resin, polypropylene, polyethylene, ABS (acrylonitrile butadiene styrene) resin, thermotropic liquid crystal and polystyrene-containing elastomer.

13. The resin composition according to claim 10, characterized in that the resin (C) comprises at least one member selected from the group consisting of polyalkylene allylate-based resin and polyamide-based resin.

14. A resin composition comprising polyamide resin having 5 to 75 wt % of aromatic ring component in a main chain and the flame retardant composition according to claim 1.

15. The resin composition according to claim 10, characterized in further comprising a filler.

16. The resin composition according to claim 15, characterized in that the content of the filler is 1 to 200 parts by weight relative to the total of 100 parts by weight of the components other than the filler.

17. A molded article formed with the resin composition according to claim 10.

18. The flame retardant composition according to claim 6, characterized in that the component (B) is phosphazene compound.

19. The flame retardant composition according to claim 6 characterized in that the composition further incorporate a nitrogen containing compound.

20. A flame retardant composition comprising:
(A) a novolac-type phenol-based resin which has an area fraction (a) with a weight average molecular weight in polystyrene equivalent of 870 or more and an area fraction (b) with a weight average molecular weight in polystyrene equivalent of less than 870, the area fraction (a) being 74% or more and 98% or less based on the total 100% of the area fractions (a) and (b), has a weight average molecular weight in polystyrene equivalent of 2,000 to 80,000, the weight average molecular weight in polystyrene equivalent being measured with a gel permeation chromatography using a tetrahydrofuran as a solvent at a column temperature of 35° C. at a flow rate of 1 mL/min, and has a content of a tri-nuclear complex composition of 7% or less;
(B) a phosphazene compound with a cyclic trimer content of 76 wt % or more; and a triazine-based compound.

21. The flame retardant composition according to claim 6, characterized in that the contents of the components (A) and (B) are 1 to 90 parts by weight and 10 to 99 parts by weight, respectively, relative to the total of 100 parts by weight of the components (A) and (B).

22. The flame retardant composition according to claim 20, characterized in that the contents of the components (A) and (B) are 1 to 90 parts by weight and 10 to 99 parts by weight, respectively, relative to the total of 100 parts by weight of the components (A) and (B).

23. The flame retardant composition according to claim 6, further comprising a resin (C) different from the phenol-based resin (A).

24. The flame retardant composition according to claim 20, further comprising a resin (C) different from the phenol-based resin (A).

25. A resin composition comprising polyamide resin having 5 to 75 wt % of aromatic ring component in a main chain and the flame retardant composition according to claim 6.

26. A resin composition comprising polyamide resin having 5 to 75 wt % of aromatic ring component in a main chain and the flame retardant composition according to claim 20.

* * * * *